(12) United States Patent
Hirabayashi et al.

(10) Patent No.: US 7,112,125 B2
(45) Date of Patent: Sep. 26, 2006

(54) POLISHING CLOTH, POLISHING APPARATUS AND METHOD OF MANUFACTURING SEMICONDUCTOR DEVICES

(75) Inventors: Hideaki Hirabayashi, Yokohama (JP); Akiko Saito, Yokohama (JP); Naoaki Sakurai, Yokohama (JP); Yoshihiro Oshibe, Chita-gun (JP); Masahiro Ishidoya, Chigasaki (JP)

(73) Assignees: Kabushiki Kaisha Toshiba, Tokyo (JP); NOF Corporation, Tokyo (JP)

( * ) Notice: Subject to any disclaimer, the term of this patent is extended or adjusted under 35 U.S.C. 154(b) by 24 days.

(21) Appl. No.: 10/412,298

(22) Filed: Apr. 14, 2003

(65) Prior Publication Data

US 2003/0199230 A1    Oct. 23, 2003

Related U.S. Application Data

(63) Continuation of application No. PCT/JP01/08717, filed on Oct. 3, 2001.

(30) Foreign Application Priority Data

Oct. 12, 2000    (JP) .............................. 2000-312288
Jul. 11, 2001    (JP) .............................. 2001-210856

(51) Int. Cl.
*B24B 1/00*    (2006.01)
*B24B 7/00*    (2006.01)

(52) U.S. Cl. .......................... 451/288; 51/307; 51/309; 451/36; 451/60; 451/526; 451/550

(58) Field of Classification Search ................. 51/298, 51/299, 300, 307, 309; 451/36, 41, 60, 285, 451/286, 287, 288, 526, 550
See application file for complete search history.

(56) References Cited

U.S. PATENT DOCUMENTS

| | | | | |
|---|---|---|---|---|
| 4,576,612 A | * | 3/1986 | Shukla et al. ................. | 51/295 |
| 4,871,376 A | * | 10/1989 | DeWald ....................... | 51/298 |
| 4,927,432 A | | 5/1990 | Budinger et al. | |
| 5,213,589 A | * | 5/1993 | Ronning et al. .............. | 51/293 |
| 5,976,000 A | | 11/1999 | Hudson | |
| 6,139,594 A | * | 10/2000 | Kincaid et al. ............... | 51/295 |
| 6,656,018 B1 | * | 12/2003 | Hsu et al. ..................... | 451/41 |
| 2002/0069591 A1 | * | 6/2002 | Yancey ......................... | 51/297 |

FOREIGN PATENT DOCUMENTS

| | | |
|---|---|---|
| JP | 3-277465 | 12/1991 |
| JP | 6-157940 | 6/1994 |
| JP | 2000-33552 | 2/2000 |
| JP | 2000-34416 | 2/2000 |

* cited by examiner

*Primary Examiner*—Timothy V. Eley
(74) *Attorney, Agent, or Firm*—Oblon, Spivak, McClelland, Maier & Neustadt, P.C.

(57) ABSTRACT

There is disclosed a polishing cloth having an abrasive layer containing a polymer material which is a hydrolyzable with an aqueous medium and being capable of exhibiting a stable polishing performance for a relatively long period of time without necessitating a dressing treatment.

21 Claims, 2 Drawing Sheets

POLISHING CLOTH, POLISHING APPARATUS AND METHOD OF MANUFACTURING SEMICONDUCTOR DEVICES

CROSS-REFERENCE TO RELATED APPLICATIONS

This is a Continuation Application of PCT Application No. PCT/JP01/08717, filed Oct. 3, 2001, which was not published under PCT Article 21(2) in English.

This application is based upon and claims the benefit of priority from the prior Japanese Patent Applications No. 2000-312288, filed Oct. 12, 2000; and No. 2001-210856, filed Jul. 11, 2001, the entire contents of both of which are incorporated herein by reference.

BACKGROUND OF THE INVENTION

1. Field of the Invention

The present invention relates to a polishing cloth, a polishing apparatus and a method of manufacturing semiconductor devices.

2. Description of the Related Art

A polishing apparatus provided with a polishing cloth has been conventionally employed in the manufacture of a semiconductor device when it is desired to mirror-finish a semiconductor substrate (for example, a semiconductor wafer), to flatten an insulating film deposited on a semiconductor wafer, or to perform the back etching of a metal film to form a buried wiring.

This polishing apparatus is generally formed of a structure comprising a turntable whose surface is constituted by an underlying layer formed of rigid polyurethane foam or of a 2-ply structure consisting of a rigid polyurethane foam layer and a polyurethane nonwoven fabric layer, and by a polishing cloth having a rough surface and covering the underlying layer; a supply pipe for feeding a polishing slurry containing abrasive grains to the polishing cloth; and a holder rotatively and vertically movably disposed over the, turntable. When it is desired to flatten an insulating film deposited on wirings formed on the surface of semiconductor wafer for example, this polishing apparatus can be operated as follows. First of all, the semiconductor wafer is held by making use of the holder in such a manner that the insulating film to be polished faces the polishing cloth, and, while keeping the feeding of a polishing slurry containing abrasive grains to the polishing cloth, the semiconductor wafer is permitted to contact with the polishing cloth by applying a desired magnitude of load to the semiconductor wafer by means of the holder. On this occasion, the holder and the turntable are kept rotating in the same direction with each other.

In this polishing operation, the open interstices (generally 40–50 μm in diameter) of the polishing cloth are filled with abrasive grains having a diameter of 0.2 μm and included in the polishing slurry, thereby enabling the abrasive grains to be homogenously dispersed at the interface between the polishing cloth and the semiconductor wafer. At the same time, the abrasive grains are also permitted to remain at the portions of the polishing cloth which are located between the open interstices. As a result, the insulating film can be mechanically polished, thus achieving the flattening of the surface of the insulating film.

However, when this polishing operation is continued for a long period of time, the abrasive grains are accumulated in the open interstices, thus increasing the quantity of the abrasive grains on the portions located between the open interstices of the polishing cloth. Namely, the polishing power by the abrasive grains is enhanced. As a result, the polishing rate is increased as compared with the initial polishing rate, thus bringing out so-called fluctuation of polishing performance.

The polishing cloth which fluctuates in polishing performance as described above has been conventionally subjected to a regeneration treatment by making use of a dressing apparatus provided with a dressing tool having a large number of diamond particles electrodeposited on a metallic substrate. However, it is very difficult to avoid this fluctuation of polishing performance of polishing cloth unless the aforementioned dressing treatment is performed after finishing every polishing operation. This makes the polishing operation very troublesome because of the inclusion of the aforementioned dressing treatment.

BRIEF SUMMARY OF THE INVENTION

An object of the present invention is to provide a polishing cloth which is capable of exhibiting a stable polishing performance for a relatively long period of time without necessitating a dressing treatment.

Another object of the present invention is to provide a polishing cloth which is provided with an automatic abrasive grain-feeding capability and capable of exhibiting a stable polishing performance for a relatively long period of time without necessitating a dressing treatment.

A further object of the present invention is to provide a polishing apparatus provided with aforementioned cloth capable of exhibiting a stable polishing performance.

A further object of the present invention is to provide a method of manufacturing a semiconductor device, which makes it possible to reliably form a conductive member, such as a buried wiring layer, with high precision in at least one embedding portion selected from groove and opening formed in an insulating film which has been deposited on a semiconductor substrate.

According to the present invention, there is provided a polishing cloth comprising an abrasive layer containing a polymer material which is a hydrolyzable with an aqueous medium.

According to the present invention, there is also provided a polishing cloth comprising an abrasive layer containing a polymer material which is a hydrolyzable with an aqueous medium and at least one abrasive grain selected from the group consisting of cerium oxide, manganese oxide, silica, alumina and zirconia, the abrasive grain being dispersed in the polymer material.

According to the present invention, there is also provided a polishing cloth comprising an abrasive layer containing a polymer material which is a soluble in an aqueous medium.

According to the present invention, there is also provided a polishing cloth comprising an abrasive layer containing a polymer material which is a soluble in an aqueous medium and at least one kind of abrasive grain selected from the group consisting of cerium oxide, manganese oxide, silica, alumina and zirconia, the abrasive grain being dispersed in the polymer material.

According to the present invention, there is also provided a polishing cloth comprising an abrasive layer having dispersed therein at least one abrasive grain selected from the group consisting of cerium oxide, manganese oxide, silica, alumina and zirconia, wherein a surface portion of the abrasive layer is prohibited from eluting in the presence of an aqueous medium, until the abrasive layer is subjected to frictional stress, and is permitted to elute in the presence of an aqueous medium, when the abrasive layer is subjected to frictional stress, concomitantly permitting the abrasive grain to be supplied to the surface of the abrasive layer.

According to the present invention, there is also provided a polishing apparatus comprising:

a turntable having a surface which is covered with a polishing cloth having an abrasive layer containing a polymer material which is a hydrolyzable with an aqueous medium;

holding means which is rotatively and vertically movably disposed over the turntable and is designed to hold a subject member to be polished, the holding means being also designed to impose a desired magnitude of load on the subject member to thereby enable the subject member to be press-contacted with the abrasive cloth of the turntable, and further designed to rotate in the same direction as that of the turntable; and feeding means for feeding a polishing slurry containing abrasive grains to the polishing cloth.

According to the present invention, there is also provided a polishing apparatus comprising:

a turntable having a surface which is covered with a polishing cloth having an abrasive layer containing a polymer material which is a hydrolyzable with an aqueous medium and at least one abrasive grain selected from the group consisting of cerium oxide, manganese oxide, silica, alumina and zirconia, the abrasive grain being dispersed in the polymer material;

holding means which is rotatively and vertically movably disposed over the turntable and is designed to hold a subject member to be polished, the holding means being also designed to impose a desired magnitude of load on the subject member to thereby enable the subject member to be press-contacted with the abrasive cloth of the turntable, and further designed to rotate in the same direction as that of the turntable; and feeding means for feeding a polishing composition containing at least water and abrasive grain free to the polishing cloth.

According to the present invention, there is also provided a polishing apparatus comprising:

a turntable having a surface which is covered with a polishing cloth having an abrasive layer containing a polymer material which is a soluble in an aqueous medium;

holding means which is rotatively and vertically movably disposed over the turntable and is designed to hold a subject member to be polished, the holding means being also designed to impose a desired magnitude of load on the subject member to thereby enable the subject member to be press-contacted with the abrasive cloth of the turntable, and further designed to rotate in the same direction as that of the turntable; and feeding means for feeding a polishing slurry containing abrasive grains to the polishing cloth.

According to the present invention, there is also provided a polishing apparatus comprising:

a turntable having a surface which is covered with a polishing cloth having an abrasive layer containing a polymer material which is a soluble in an aqueous medium and at least one abrasive grain selected from the group consisting of cerium oxide, manganese oxide, silica, alumina and zirconia, the abrasive grain being dispersed in the polymer material;

holding means which is rotatively and vertically movably disposed over the turntable and is designed to hold a subject member to be polished, the holding means being also designed to impose a desired magnitude of load on the subject member to thereby enable the subject member to be press-contacted with the abrasive cloth of the turntable, and further designed to rotate in the same direction as that of the turntable; and feeding means for feeding a polishing composition containing at least water and abrasive grain free to the polishing cloth.

According to the present invention, there is also provided a polishing apparatus comprising:

a turntable having a surface which is covered with a polishing cloth including an abrasive layer, a surface portion of which is permitted to elute in the presence of an aqueous medium, when the abrasive layer is subjected to frictional stress;

holding means which is rotatively and vertically movably disposed over the turntable and is designed to hold a subject member to be polished, the holding means being also designed to impose a desired magnitude of load on the subject member to thereby enable the subject member to be press-contacted with the abrasive cloth of the turntable, and further designed to rotate in the same direction as that of the turntable; and feeding means for feeding a polishing slurry containing abrasive grains to the polishing cloth.

According to the present invention, there is also provided a polishing apparatus comprising:

a turntable having a surface which is covered with a polishing cloth including an abrasive layer having dispersed therein at least one abrasive grain selected from the group consisting of cerium oxide, manganese oxide, silica, alumina and zirconia, wherein a surface portion of the abrasive layer is permitted to elute in the presence of an aqueous medium, when the abrasive layer is subjected to frictional stress, concomitantly permitting the abrasive grain to be supplied to the surface of the abrasive layer;

holding means which is rotatively and vertically movably disposed over the turntable and is designed to hold a subject member to be polished, the holding means being also designed to impose a desired magnitude of load on the subject member to thereby enable the subject member to be press-contacted with the abrasive cloth of the turntable, and further designed to rotate in the same direction as that of the turntable; and feeding means for feeding a polishing composition containing at least water and abrasive grain free to the polishing cloth.

According to the present invention, there is also provided a method of manufacturing a semiconductor device, which comprises the steps of:

providing a polishing apparatus comprising,
(a) a turntable having a surface which is covered with a polishing cloth having an abrasive layer containing a polymer material which is a hydrolyzable with an aqueous medium;
(b) holding means which is rotatively and vertically movably disposed over the turntable and is designed to hold a subject member to be polished, the holding means being also designed to impose a desired magnitude of load on the subject member to thereby enable the subject member to be press-contacted with the abrasive cloth of the turntable, and further designed to rotate in the same direction as that of the turntable; and
(c) feeding means for feeding a polishing slurry containing abrasive grains to the polishing cloth, forming at least one embedding portion selected from a groove corresponding to a configuration of a wiring layer and an opening corresponding to a configuration of a via-fill in an insulating film deposited on a semiconductor substrate;

forming a wiring material film made of copper or copper alloy on a surface of the insulating film including the inner surface of the embedding portion; and polishing the wiring material film by making use of the polishing apparatus, thereby forming at least, one conductive member selected from a wiring layer and a via-fill in the embedding portion.

According to the present invention, there is also provided a method of manufacturing a semiconductor device, which comprises the steps of:

providing a polishing apparatus comprising,
(a) a turntable having a surface which is covered with a polishing cloth having an abrasive layer containing a polymer material which is a hydrolyzable with an aqueous medium and at least one abrasive grain selected from the group consisting of cerium oxide, manganese oxide, silica, alumina and zirconia, the abrasive grain being dispersed in the polymer material;
(b) holding means which is rotatively and vertically movably disposed over the turntable and is designed to hold a subject member to be polished, the holding means being also designed to impose a desired magnitude of load on the subject member to thereby enable the subject member to be press-contacted with the abrasive cloth of the turntable, and further designed to rotate in the same direction as that of the turntable; and
(c) feeding means for feeding a polishing composition containing at least water and abrasive grain free to the polishing cloth, forming at least one embedding portion selected from a groove corresponding to a configuration of a wiring layer and an opening corresponding to a configuration of a via-fill in an insulating film deposited on a semiconductor substrate;

forming a wiring material film made of copper or copper alloy on a surface of the insulating film including the inner surface of the embedding portion; and polishing the wiring material film by making use of the polishing apparatus, thereby forming at least one conductive member selected from a wiring layer and a via-fill in the embedding portion.

According to the present invention, there is also provided a method of manufacturing a semiconductor device, which comprises the steps of:

providing a polishing apparatus comprising,
(a) a turntable having a surface which is covered with a polishing cloth having an abrasive layer containing a polymer material which is a soluble in an aqueous medium;
(b) holding means which is rotatively and vertically movably disposed over the turntable and is designed to hold a subject member to be polished, the holding means being also designed to impose a desired magnitude of load on the subject member to thereby enable the subject member to be press-contacted with the abrasive cloth of the turntable, and further designed to rotate in the same direction as that of the turntable; and
(c) feeding means for feeding a polishing slurry containing abrasive grains to the polishing cloth, forming at least one embedding portion selected from a groove corresponding to a configuration of a wiring layer and an opening corresponding to a configuration of a via-fill in an insulating film deposited on a semiconductor substrate;

forming a wiring material film made of copper or copper alloy on a surface of the insulating film including the inner surface of the embedding portion; and polishing the wiring material film by making use of the polishing apparatus, thereby forming at least one conductive member selected from a wiring layer and a via-fill in the embedding portion.

According to the present invention, there is also provided a method of manufacturing a semiconductor device, which comprises the steps of:

providing a polishing apparatus comprising,
(a) a turntable having a surface which is covered with a polishing cloth having an abrasive layer containing a polymer material which is a soluble in an aqueous medium and at least one abrasive grain selected from the group consisting of cerium oxide, manganese oxide, silica, alumina and zirconia, the abrasive grain being dispersed in the polymer material;
(b) holding means which is rotatively and vertically movably disposed over the turntable and is designed to hold a subject member to be polished, the holding means being also designed to impose a desired magnitude of load on the subject member to thereby enable the subject member to be press-contacted with the abrasive cloth of the turntable, and further designed to rotate in the same direction as that of the turntable; and
(c) feeding means for feeding a polishing composition containing at least water and abrasive grain free to the polishing cloth, forming at least one embedding portion selected from a groove corresponding to a configuration of a wiring layer and an opening corresponding to a configuration of a via-fill in an insulating film deposited on a semiconductor substrate;

forming a wiring material film made of copper or copper alloy on a surface of the insulating film including the inner surface of the embedding portion; and polishing the wiring material film by making use of the polishing apparatus, thereby forming at least one conductive member selected from a wiring layer and a via-fill in the embedding portion.

According to the present invention, there is also provided a method of manufacturing a semiconductor device, which comprises the steps of:

providing a polishing apparatus comprising,
(a) a turntable having a surface which is covered with a polishing cloth having an abrasive layer, a surface portion of which is permitted to elute in the presence of an aqueous medium, when the abrasive layer is subjected to frictional stress;
(b) holding means which is rotatively and vertically movably disposed over the turntable and is designed to hold a subject member to be polished, the holding means being also designed to impose a desired magnitude of load on the subject member to thereby enable the subject member to be press-contacted with the abrasive cloth of the turntable, and further designed to rotate in the same direction as that of the turntable; and
(c) feeding means for feeding a polishing slurry containing abrasive grains to the polishing cloth, forming at least one embedding portion selected from a groove corresponding to a configuration of a wiring layer and an opening corresponding to a configuration of a via-fill in an insulating film deposited on a semiconductor substrate;

forming a wiring material film made of copper or copper alloy on a surface of the insulating film including the inner surface of the embedding portion; and polishing the wiring material film by making use of the polishing apparatus, thereby forming at least one conductive member selected from a wiring layer and a via-fill in the embedding portion.

According to the present invention, there is also provided a method of manufacturing a semiconductor device, which comprises the steps of:

providing a polishing apparatus comprising, (a) a turntable having a surface which is covered with a polishing cloth including an abrasive layer having dispersed therein at least one abrasive grain selected from the group consisting of cerium oxide, manganese oxide, silica, alumina and zirconia, wherein a surface portion of the abrasive layer is permitted to elute in the presence of an aqueous medium, when the abrasive layer is subjected to frictional stress, concomitantly permitting the abrasive grain to be supplied to the surface of the abrasive layer;

(b) holding means which is rotatively and vertically movably disposed over the turntable and is designed to hold a subject member to be polished, the holding means being also designed to impose a desired magnitude of load on the subject member to thereby enable the subject member to be press-contacted with the abrasive cloth of the turntable, and further designed to rotate in the same direction as that of the turntable; and (c) feeding means for feeding a polishing composition containing at least water and abrasive grain free to the polishing cloth, forming at least one embedding portion selected from a groove corresponding to a configuration of a wiring layer and an opening corresponding to a configuration of a via-fill in an insulating film deposited on a semiconductor substrate;

forming a wiring material film made of copper or copper alloy on a surface of the insulating film including the inner surface of the embedding portion; and polishing the wiring material film by making use of the polishing apparatus, thereby forming at least one conductive member selected from a wiring layer and a via-fill in the embedding portion.

DETAILED DESCRIPTION OF THE INVENTION

Figure 1:
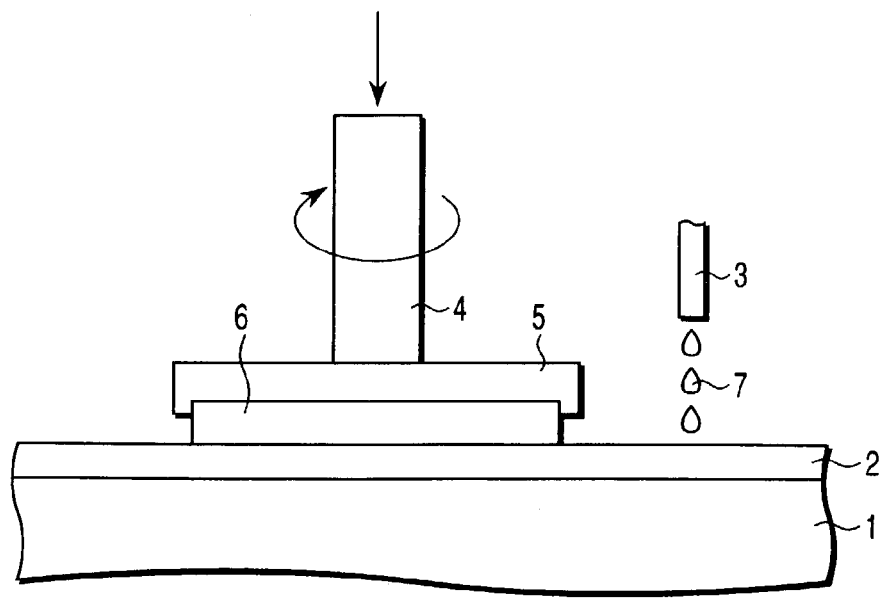
FIG. 1 is a schematic view illustrating one embodiment of a polishing apparatus according to the present invention.

Next, the present invention will be explained in detail.

First of all, six kinds of polishing cloth according to the present invention will be explained in detail.

(1) Polishing Cloth:

This polishing cloth comprises an abrasive layer containing a polymer material which is a hydrolyzable with an aqueous medium. Specific examples of this polishing cloth include those consisting only of an abrasive layer which can be molded by way of injection molding of the aforementioned polymer material, or those comprising a substrate made of a material selected from various kinds of materials such as metal, and an abrasive layer which is deposited on the substrate for example by the casting of the aforementioned polymer material.

This polymer material should preferably be selected from those which comprise a backbone chain provided with a branched chain having a structure that is a hydrolyzable with an aqueous medium.

As for the structure which is a hydrolyzable with an aqueous medium, those represented by the following formula (I) or (II) may be exemplified:

(I)

wherein $R^1$, $R^2$ and $R^3$ may be the same or different and are individually hydrogen atom, an alkyl group or aryl group:

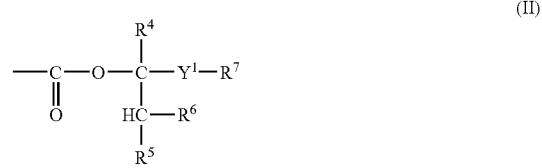

(II)

wherein $R^4$, $R^5$ and $R^6$ may be the same or different and are individually hydrogen atom or an organic group having 1 to 18 carbon atoms; $R^7$ is an organic group having 1 to 18 carbon atoms; and $R^6$ and $R^7$ may be connected together to form a heterocycle having $Y^1$ as a heteroatom, $Y^1$ being oxygen atom or sulfur atom.

The $R^1$, $R^2$ and $R^3$ in the aforementioned formula (1) represent individually hydrogen atom, an alkyl group or aryl group. Alkyl group in this case should preferably be selected from those having 1 to 18 carbon atoms, more preferably from a linear alkyl group, most preferably from a linear alkyl group having 1 to 4 carbon atoms.

Specific examples of this alkyl group include methyl, ethyl, n-propyl, isopropyl, n-butyl, sec-butyl, isobutyl, n-amyl, isoamyl, sec-amyl, n-pentyl, n-octyl, dodecyl, cetyl, stearyl, etc.

As for aforementioned aryl group, it is possible to employ phenyl, substituted phenyl, naphthyl, substituted naphthyl, etc.

As for the examples of the polymer material where a branched chain attached to the backbone chain thereof is formed of the structure represented by the aforementioned formula (I) that is a hydrolyzable with an aqueous medium, it is possible to employ a homopolymer or a copolymer to be obtained through the homopolymerization or copolymerization of, for example, trialkylsilyl α,β-unsaturated carboxylate which can be produced through a reaction between carboxyl group-containing α,β-unsaturated monomer and trialkylsilyl chloride. As for the specific examples of the carboxyl group-containing α,β-unsaturated monomer to be employed herein, it is possible to employ acrylic acid, methacrylic acid, itaconic acid, mesaconic acid, maleic acid, fumaric acid, etc. Further, as for specific examples of the trialkylsilyl chloride, it is possible to employ silyl chlorides of trimethyl, triethyl, tri-n-propyl, tri-isopropyl, tri-n-butyl, tri-sec-butyl, tri-isobutyl, tri-n-amyl, tri-isoamyl, tri-sec-amyl, tri-n-pentyl, tri-n-octyl, tridecyl, tricetyl, triphenyl, tri-p-methylphenyl, tribenzyl, etc.

As for the specific examples of the polymer material where a branched chain attached to the backbone chain thereof is formed of a structure represented by the aforementioned formula (I) that is a hydrolyzable with an aqueous medium, it is possible to employ α,β-unsaturated homopolymer or copolymer each having a repeating unit of monomer represented by the following formula (III) or (IV):

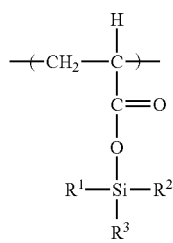
(III)

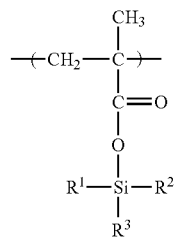
(IV)

wherein $R^1$, $R^2$ and $R^3$ may be the same or different and are individually hydrogen atom, an alkyl group or aryl group.

As the specific examples of the trialkylsilyl α,β-unsaturated carboxylate (silyl acrylate) which corresponds to the repeating unit of monomer represented by the aforementioned formula (III), the compounds represented by the following formulas (III-1) to (III-22) can be exemplified. As the specific examples of the trialkylsilyl α,β-unsaturated carboxylate (silyl methacrylate) which corresponds to the repeating unit of monomer represented by the aforementioned formula (IV), the compounds represented by the following formulas (IV-1) to (IV-22) can be exemplified.

Trimethylsilyl acrylate:

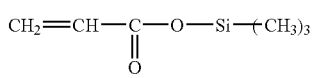
(III-1)

Triethylsilyl acrylate:

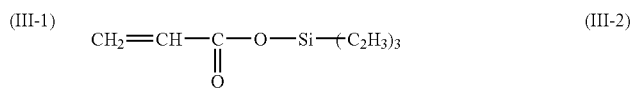
(III-2)

Tri-n-propylsilyl acrylate:

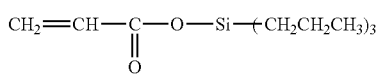
(III-3)

Tri-iso-propylsilyl acrylate:

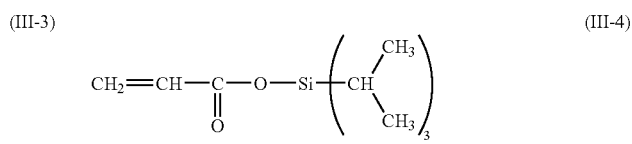
(III-4)

Tri-n-butylsilyl acrylate:

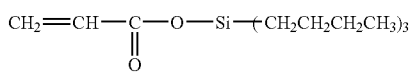
(III-5)

Tri-iso-butylsilyl acrylate:

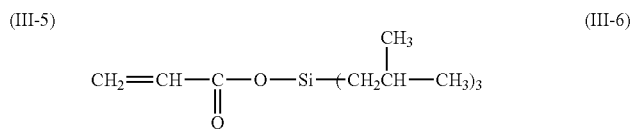
(III-6)

Tri-sec-butysilyl acrylate:

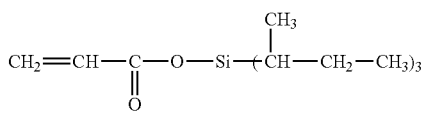
(III-7)

Tri-n-amylsilyl acrylate:

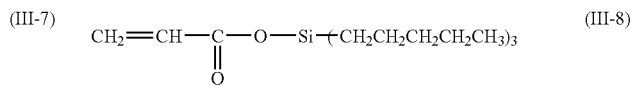
(III-8)

Tri-n-hexylsilyl acrylate:

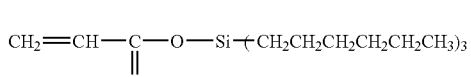
(III-9)

Tri-n-octylsilyl acrylate:

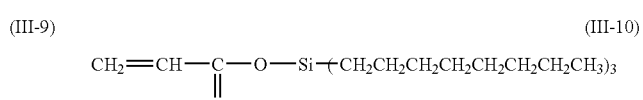
(III-10)

Tri-n-dodecylsilyl acrylate:

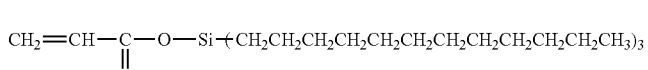
(III-11)

Triphenylsilyl acrylate:

Tri-p-methylphenyl acrylate:

-continued

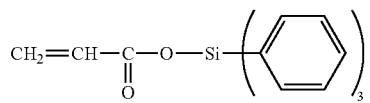
Tribenzylsilyl acrylate: (III-12)

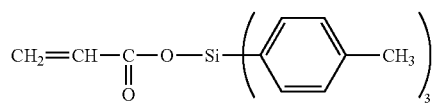
Ethyldimethylsilyl acrylate: (III-13)

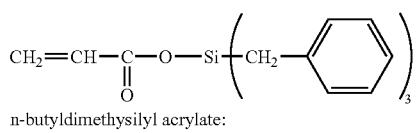
n-butyldimethysilyl acrylate: (III-14)

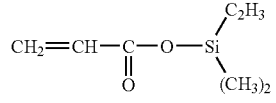
Di-iso-propyl-n-butylsilyl acrylate: (III-15)

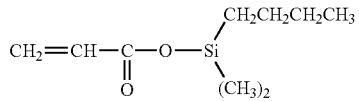
n-octyl-di-n-butylsilyl acrylate: (III-16)

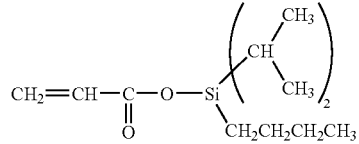
Di-iso-propylstearylsilyl acrylate: (III-17)

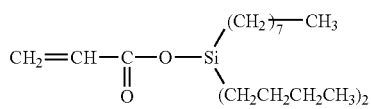
Dicyclohexylphenyl acrylate: (III-18)

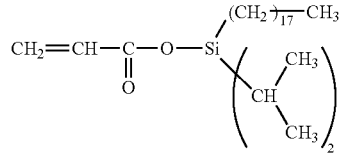
t-butyphenylsilyl acrylate: (III-19)

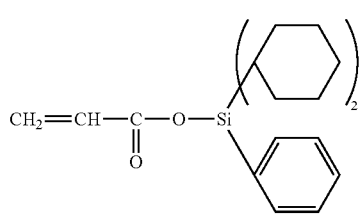
Lauryldiphenylsilyl acrylate: (III-20)

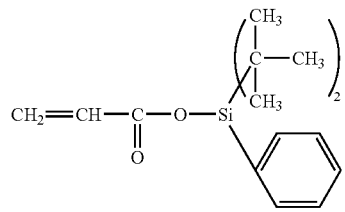
Trimethylsilyl methacrylate: (III-21)

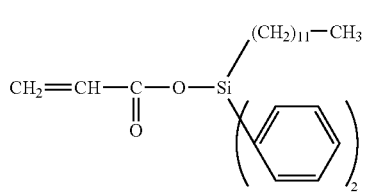
Triethylsilyl methacrylate: (III-22)

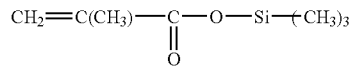
Tri-n-propylsilyl methacrylate: (IV-1)

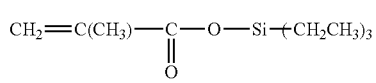
Tri-iso-propylsilyl methacrylate: (IV-2)

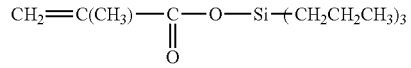
Tri-n-butysilyl methacrylate: (IV-3)

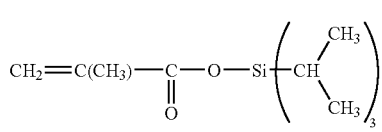
Tri-iso-butysilyl methacrylate: (IV-4)

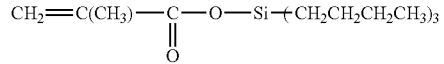
Tri-sec-butylsilyl methacrylate: (IV-5)

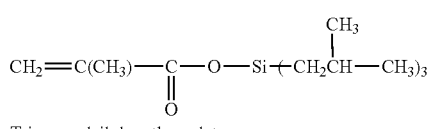
Tri-n-amylsilyl methacrylate: (IV-6)

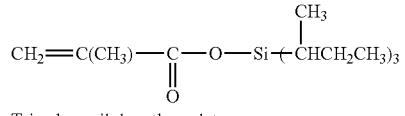
Tri-n-hexysilyl methacrylate: (IV-7)

-continued

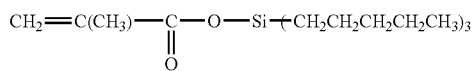
(IV-8)

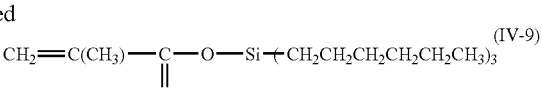
(IV-9)

Tri-n-octylsilyl methacrylate:

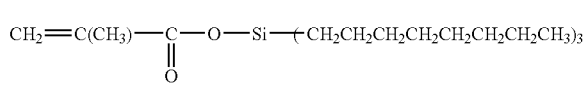
(IV-10)

Tri-n-dodecylsilyl methacrylate:

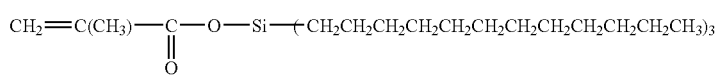
(IV-11)

Triphenylsilyl methacrylate:

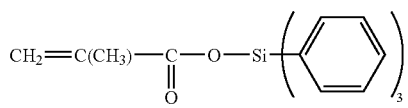
(IV-12)

Tri-p-methylphenyl methacrylate:

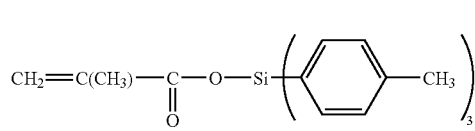
(IV-13)

Tribenzylsilyl methacrylate:

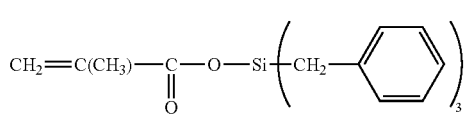
(IV-14)

Ethyldimethylsilyl methacrylate:

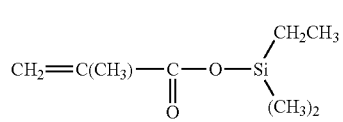
(IV-15)

n-butyldimethylsilyl methacrylate:

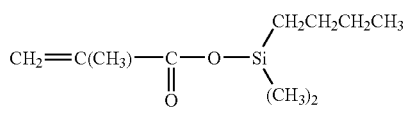
(IV-16)

Di-iso-propyl-n-butysilyl methacrylate:

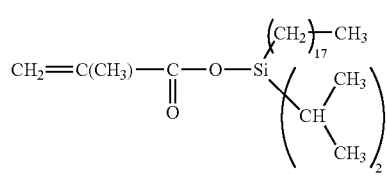
(IV-17)

n-octyl-di-n-butylsilyl methacrylate:

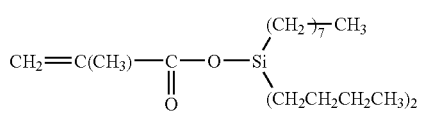
(IV-18)

Di-iso-propylstearylsilyl methacrylate:

(IV-19)

Dicyclohexylphenyl methacrylate:

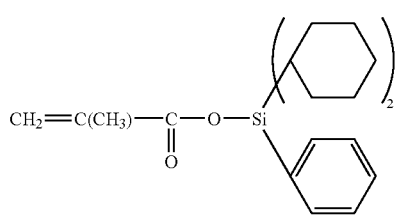
(IV-20)

t-butylphenylsilyl methacrylate:

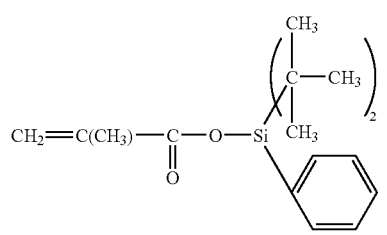
(IV-21)

Lauryldiphenylsilyl methacrylate:

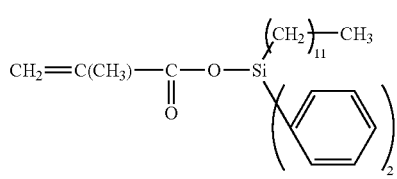
(IV-22)

Further, preferable examples of the trialkylsilyl α,β-unsaturated carboxylate are represented by the following formulas (VII-1) to (VII-10).

Tri-iso-propylsilylmethyl maleate:

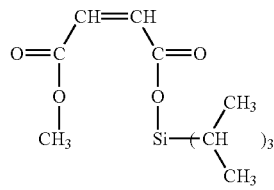
(VII-1)

Tri-iso-propylsilylamyl maleate:

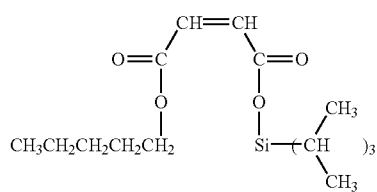
(VII-2)

Tri-n-butylsilyl-n-butyl maleate:

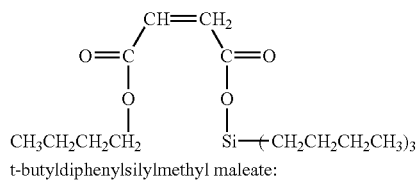
(VII-3)

t-butyldiphenylsilylmethyl maleate:

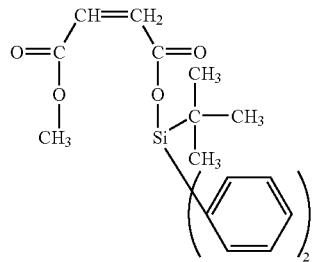
(VII-4)

t-butyldiphenylsilyl-n-butyl maleate:

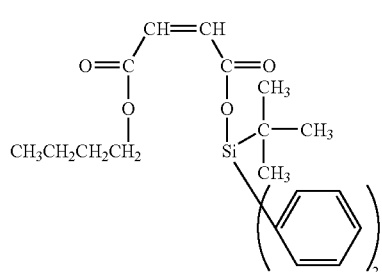
(VII-5)

Tri-iso-propylsilylmethyl fumarate:

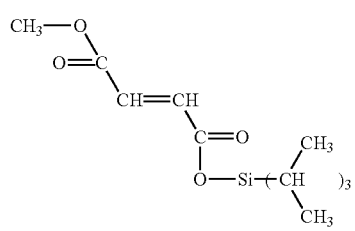
(VII-6)

-continued

Tri-iso-propylsilylamyl fumarate:

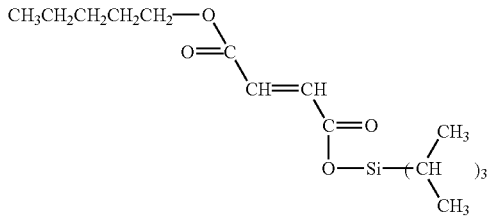
(VII-7)

Tri-n-butylsilyl-n-butyl fumarate:

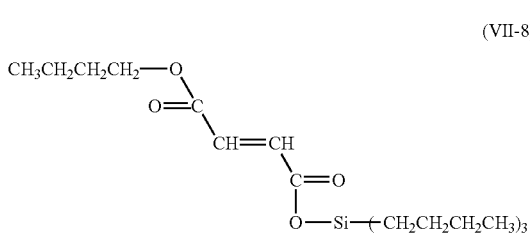
(VII-8)

t-butyldiphenylsilylmethyl fumarate:

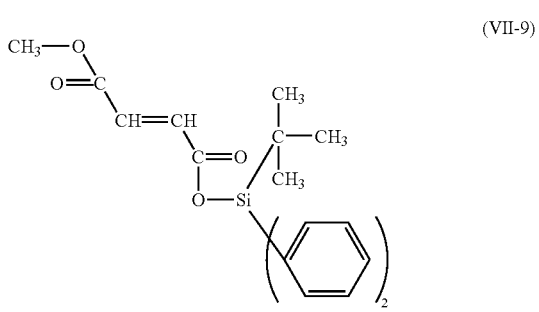
(VII-9)

t-butyldiphenylsilyl-n-butyl fumarate:

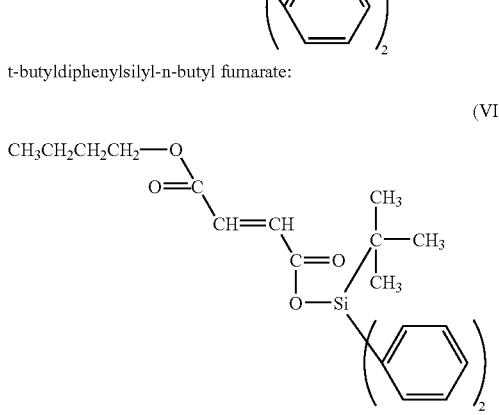
(VII-10)

If the aforementioned polymer material is to be constituted by a copolymer, it can be obtained through a copolymerization of trialkylsilyl α,β-unsaturated carboxylate with another kind of monomer. As for the specific examples of the monomer to be employed herein, it is possible to employ α,β-unsaturated monomers. As for the specific examples of this α,β-unsaturated monomers, it is possible to employ methyl(metha)acrylate, ethyl(metha)acrylate, n-propyl (metha)acrylate, isopropyl(metha)acrylate, n-butyl(metha) acrylate, sec-butyl(metha)acrylate, t-butyl(metha)acrylate, cyclohexyl(metha)acrylate, 2-ethylhexyl(metha)acrylate, lauryl(metha)acrylate, stearyl(metha)acrylate, styrene, α-methylstyrene, p-vinyltoluene, acrylonitrile, 2-hydroxyethyl(metha)acrylate, or adducts of polyethylene glycol or polypropylene glycol with 2-hydroxyethyl(metha)acrylate, or methyl ether or ethyl ether thereof.

The groups $R^4$, $R^5$ and $R^6$ in the aforementioned formula (II) may be the same or different and are individually hydrogen atom or an organic group having 1 to 18 carbon atoms such as alkyl group, aryl group, alkanol, etc.; $R^7$ is alkyl group, aryl group or alkanol each having 1 to 18 carbon atoms and optionally having a substituent group; and $R^6$ and $R^7$ may be connected together to form a heterocycle having $Y^1$ as a heteroatom and optionally having a substituent group. As for specific examples of this alkyl group, it is preferable to employ methyl, ethyl, n-propyl, isopropyl, n-butyl, sec-butyl, isobutyl, n-amyl, isoamyl, sec-amyl, n-pentyl, n-octyl, dodecyl, cetyl, stearyl, etc.

The compound represented by the aforementioned formula (II) and having a structure that is a hydrolyzable with an aqueous medium can be easily obtained for example through a reaction between a compound having carboxyl group (for example, a compound having one or more, preferably 1 to 120 carboxylic groups per molecule) and a compound selected from a vinyl ether compound represented by the following formula (VIII), a vinyl thioether compound, and a heterocyclic compound having a vinylic double bond and a heteroatom which is constituted by oxygen atoms or sulfur atoms.

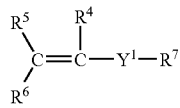

(VIII)

wherein $R^4$, $R^5$ and $R^6$ may be the same or different and are individually hydrogen atom or an organic group having 1 to 18 carbon atoms; $R^7$ is an organic group having 1 to 18 carbon atoms; and $R^6$ and $R^7$ may be connected together to form a heterocycle having $Y^1$ as a heteroatom, $Y^1$ being oxygen atom or sulfur atom.

The groups $R^4$, $R^5$ and $R^6$ in the aforementioned formula (VIII) may be the same or different and are individually hydrogen atom or an organic group having 1 to 18 carbon atoms such as alkyl group, aryl group, alkanol, etc.; $R^7$ is alkyl group, aryl group or alkanol each having 1 to 18 carbon atoms and optionally having a substituent group; and $R^6$ and $R^7$ may be connected together to form a heterocycle having $Y^1$ as a heteroatom and optionally having a substituent group.

Specific examples of the compound that can be represented by the aforementioned formula (VIII) are an aliphatic vinyl ether compound such as methylvinyl ether, ethylvinyl ether, isopropylvinyl ether, n-propylvinyl ether, n-butylvinyl ether, isobutylvinyl ether, 2-ethylhexylvinyl ether, cyclohexylvinyl ether, etc.; an aliphatic vinylthioether compound corresponding to any one of the aforementioned ethers; a cyclic vinyl ether compound such as 2,3-dihydrofuran, 3,4-dihydro-2H-pyrane, etc.; and a cyclic vinylthioether compound corresponding to any one of the aforementioned cyclic vinyl ethers.

Specific preferable examples of the polymer material having at least one carboxylic group per molecule include for example polyester resin, acrylic resin, maleic polybutadiene resin, etc.

The reaction between the compound having at least one carboxylic group per molecule and the compound represented by the aforementioned formula (VIII) can be performed generally in the presence of an acid catalyst and at a temperature ranging from room temperature to 100° C.

As for examples of the polymer material where a branched chain attached to the backbone chain thereof is formed of the structure represented by the aforementioned formula (II) that is a hydrolyzable with an aqueous medium, it is possible to employ a homopolymer or a copolymer to be obtained through the homopolymerization or copolymerization of a reaction product to be produced through a reaction between carboxyl group-containing α,β-unsaturated monomer and a compound represented by the aforementioned formula (VIII). As for the specific examples of the carboxyl group-containing α,β-unsaturated monomer to be employed herein, it is possible to employ acrylic acid, methacrylic acid, itaconic acid, mesaconic acid, maleic acid, fumaric acid, etc.

As for the specific examples of the polymer material where a branched chain attached to the backbone chain thereof is formed of a structure represented by the aforementioned formula (II) that is a hydrolyzable with an aqueous medium, it is possible to employ α,β-unsaturated homopolymer or copolymer each having a repeating unit of monomer represented by the following formula (V) or (VI):

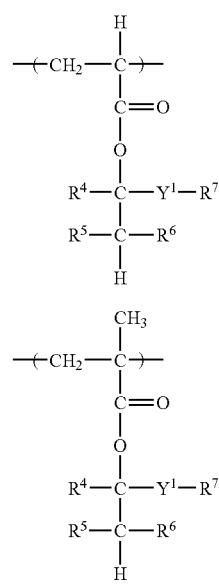

wherein $R^4$, $R^5$ and $R^6$ may be the same or different and are individually hydrogen atom or an organic group having 1 to 18 carbon atoms; $R^7$ is an organic group having 1 to 18 carbon atoms; and $R^6$ and $R^7$ may be connected together to form a heterocycle having $Y^1$ as a heteroatom, $Y^1$ being oxygen atom or sulfur atom.

The following formulas (V-1) to (V-8) are specific examples of the reaction product (hemiacetal acrylate) which can be obtained through a reaction between the carboxyl group-containing α,β-unsaturated monomer corresponding to the repeating unit of monomer represented by the aforementioned formula (V) and a compound represented by the aforementioned formula (VIII). Further, the following formulas (VI-1) to (VI-8) are specific examples of the reaction product (hemiacetal methacrylate) which can be obtained through a reaction between the carboxyl group-containing α,β-unsaturated monomer of monomer corresponding to the repeating unit represented by the aforementioned formula (VI) and a compound represented by the aforementioned formula (VIII).

1-methoxyethyl acrylate:

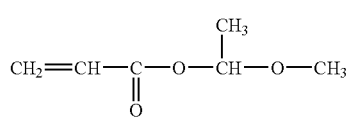
(V-1)

1-ethoxyethyl acrylate:

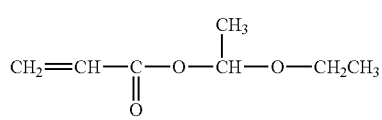
(V-2)

1-n-propoxyethyl acrylate:

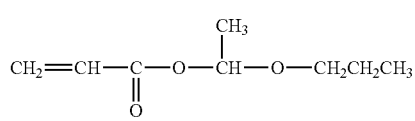
(V-3)

1-iso-propoxyethyl acrylate:

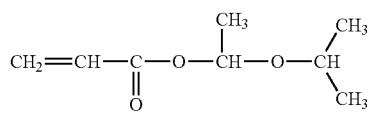
(V-4)

1-n-butoxyethyl acrylate:

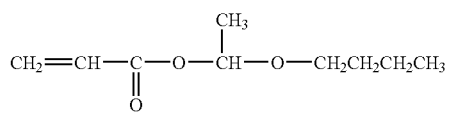
(V-5)

1-iso-butoxyethyl acrylate:

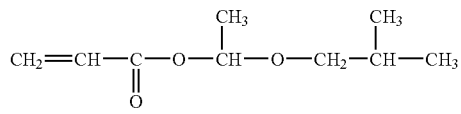
(V-6)

1-(2-ethylhexoxy)ethyl acrylate:

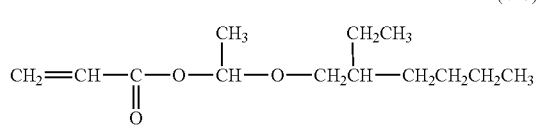
(V-7)

Pyranyl acrylate:

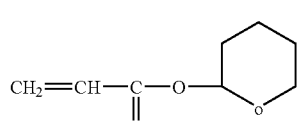
(V-8)

1-methoxyethyl methacrylate:

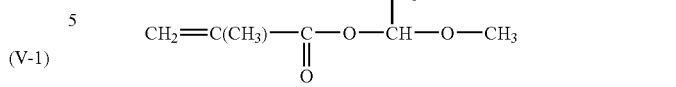
(VI-1)

1-ethoxyethyl methacrylate:

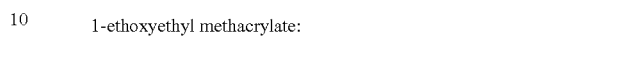
(VI-2)

1-n-propoxyethyl methacrylate:

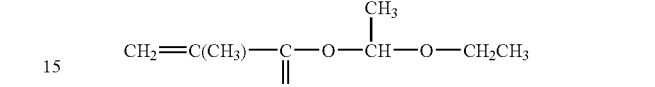
(VI-3)

1-iso-propoxyethyl methacrylate:

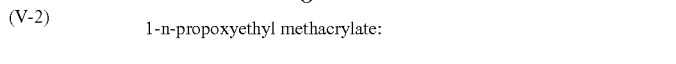
(VI-4)

1-n-butoxyethyl methacrylate:

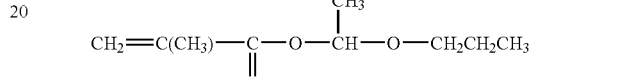
(VI-5)

1-iso-butoxyethyl methacrylate:

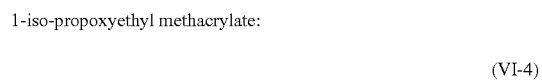
(VI-6)

1-(2-ethylhexoxy) ethyl methacrylate:

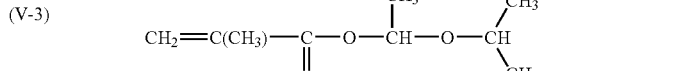
(VI-7)

Pyranyl methacrylate:

(VI-8)

Other preferable examples of the reaction product which can be obtained through a reaction between the carboxyl group-containing α,β-unsaturated monomer and a compound represented by the aforementioned formula (VIII) are exemplified by the following formulas (IX-1) to (IX-8).

Di-1-methoxyethyl maleate:

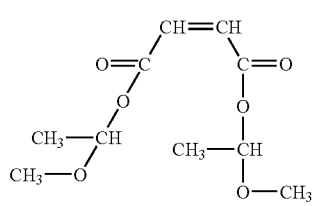
(IX-1)

Di-1-ethoxyethyl maleate:

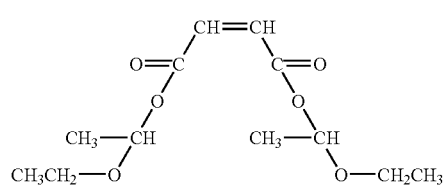
(IX-2)

Di-1-n-propoxyethyl maleate:

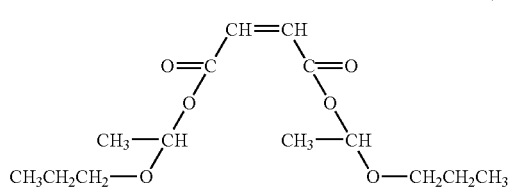
(IX-3)

Di-1-iso-propoxyethyl maleate:

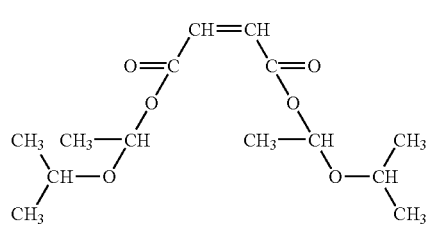
(IX-4)

Di-1-n-butoxyethyl maleate:

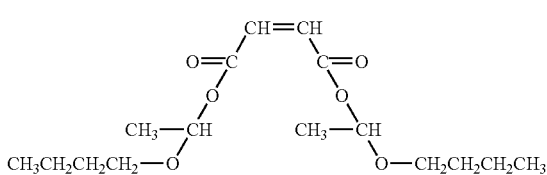
(IX-5)

Di-1-iso-butoxyethyl maleate:

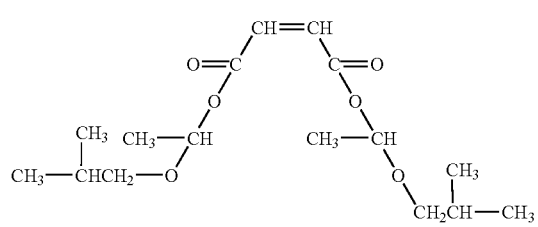
(IX-6)

Di-1-(2-ethylhexoxy) ethyl maleate:

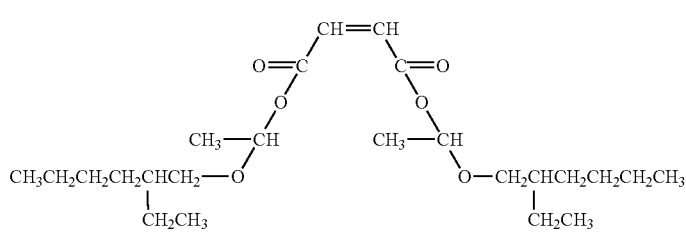
(IX-7)

Dipyranyl maleate:

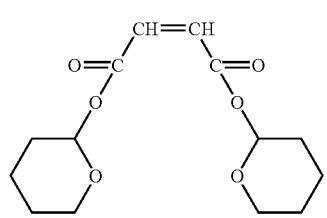
(IX-8)

If the aforementioned polymer material is to be constituted by a copolymer, it can be obtained through a copolymerization of a reaction product to be derived from the reaction between carboxyl group-containing α,β-unsaturated monomer and the compound represented by the aforementioned formula (VIII) with another kind of monomer. As for specific examples of the monomer to be employed herein, it is possible to employ α,β-unsaturated monomers. As for specific examples of this α,β-unsaturated monomers, it is possible to employ methyl (metha)acrylate, ethyl (metha)acrylate, n-propyl(metha)acrylate, isopropyl(metha)acrylate, n-butyl(metha)acrylate, sec-butyl(metha)acrylate, t-butyl(metha)acrylate, cyclohexyl(metha)acrylate, 2-ethylhexyl (metha)acrylate, lauryl(metha)acrylate, stearyl(metha)acrylate, styrene, α-methylstyrene, p-vinyltoluene, acrylonitrile, 2-hydroxyethyl(metha)acrylate, or adducts of polyethylene glycol or polypropylene glycol with 2-hydroxyethyl(metha)acrylate, or methyl ether or ethyl ether thereof.

The content of the repeating unit of monomer represented by the aforementioned formula (III), (IV), (V) or (VI) in the aforementioned polymer material should preferably be confined within the range of 20 to 100% by weight, more preferably 40 to 100% by weight. If the content of the repeating unit of monomer is less than 20% by weight, the quantity of carboxyl group to be regenerated on the occasion of the hydrolysis of the polymer material would become too small, thereby decreasing the solubility of the polymer material in an aqueous medium, thus deteriorating the polishing performance of the polishing cloth.

This polymer material should preferably be selected from those having a number average molecular weight ranging from 500 to 500,000, more preferably from 500 to 100,000, and a glass transition temperature ranging from 30 to 100° C., more preferably from 40 to 80° C. A polishing cloth comprising a polymer material having aforementioned specific ranges of number average molecular weight and of glass transition temperature is capable of further stabilizing the polishing performance thereof on the occasion of polishing a subject member to be polished.

The aforementioned abrasive layer should preferably be constructed such that particles of a substance which is higher in solubility than that of the polymer material is dispersed in the polymer material.

As for examples of such a substance, it is possible to employ rosin, cellulose, polyvinyl alcohol, etc. The particles of such a substance should preferably be dispersed at a ratio falling within the range of 1 to 50% volume based on the polymer material. Because, if the quantity of the dispersed particles is less than 1% volume, it may become difficult to sufficiently enhance the effect of these dispersed particles (the effects of promoting the dissolution of the abrasive layer in the step of polishing). On the other hand, if the quantity of the dispersed particles is higher than 50% volume, the abrasive layer may be decomposed as soon as the abrasive layer is immersed in an aqueous solution, thus making the polishing cloth incapable of functioning.

(2) Polishing Cloth:

This polishing cloth comprises an abrasive layer containing a polymer material which is a hydrolyzable with an aqueous medium and at least one abrasive grain selected from the group consisting of cerium oxide, manganese oxide, silica, alumina and zirconia, the abrasive grain being dispersed in the polymer material. Specific examples of this polishing cloth include those consisting only of an abrasive layer which can be molded by way of injection molding of the aforementioned polymer material, or those comprising a substrate made of a material selected from various kinds of material, such as metal, and an abrasive layer which is deposited on the substrate, for example, by the casting of the aforementioned polymer material.

The polymer material to be employed in this case may be the same as employed in the aforementioned polishing cloth (1).

The abrasive grains should preferably be incorporated and dispersed uniformly in the polymer material at a ratio ranging from 0.5 to 20% by weight.

The abrasive grains should preferably be spherical or nearly spherical having an average particle diameter ranging from 0.02 to 0.1 µm.

(3) Polishing Cloth:

This polishing cloth comprises an abrasive layer containing a polymer material which is a soluble in an aqueous medium. Specific examples of this polishing cloth include those consisting only of an abrasive layer which can be molded by way of injection molding of the aforementioned polymer material, or those comprising a substrate made of a material selected from various kinds of materials, such as metal, and an abrasive layer which is deposited on the substrate, for example, by the casting of the aforementioned polymer material.

This polymer material should preferably be selected from those that are a soluble in an aqueous medium at a rate of 0.01 to 10.0 mg/min. when a relative velocity between the abrasive layer and a subject member to be polished is set at 1.0 m/sec. under a condition where the subject member is permitted to contact the abrasive layer by applying a load of 300 gf/cm$^2$ to the subject member. When the dissolving rate of the polymer material is less than 0.01 mg/min., it may become difficult to satisfactorily renew the surface of the abrasive layer when the subject member to be polished is being subjected to polishing by permitting the abrasive layer and the subject member to rotate mutually while applying a desired magnitude of load to the subject member and concurrently feeding a polishing slurry containing abrasive grains and water to the abrasive layer, thus possibly resulting in a local accumulation of the abrasive grains on the surface of the abrasive layer. On the other hand, when the dissolving rate of the polymer material is higher than 10.0 mg/min., the polishing slurry may be forcedly discharged from the abrasive layer due to an increased dissolution rate of the surface of the abrasive layer during the polishing of the subject member to be polished, thereby making it difficult to sufficiently feed the abrasive grains of the slurry to an interface between the abrasive layer and the subject member.

The polymer material may be a homopolymer or a copolymer that can be derived from a polymerization of at least one monomer selected from the group consisting of acrylic acid, methacrylic acid, itaconic acid, fumaric acid, maleic acid, hydroxyalkyl acrylate, hydroxyalkyl methacrylate, N-vinyl-2-pyrrolidone, methylvinyl ether, N-vinylformamide and N,N-dimethylacryl amide.

(4) Polishing Cloth:

This polishing cloth comprises an abrasive layer containing a polymer material which is a soluble in an aqueous medium and at least one abrasive grain selected from the group consisting of cerium oxide, manganese oxide, silica, alumina and zirconia, the abrasive grain being dispersed in the polymer material. Specific examples of this polishing cloth include those consisting only of an abrasive layer which can be molded by way of injection molding of the aforementioned polymer material, or those comprising a substrate made of a material selected from various kinds of material, such as metal, and an abrasive layer which is deposited on the substrate, for example, by the casting of the aforementioned polymer material.

This polymer material to be employed in this case may be the same as employed in the aforementioned polishing cloth (3).

The abrasive grains should preferably be incorporated and dispersed uniformly in the polymer material at a ratio ranging from 0.5 to 20% by weight.

The abrasive grains should preferably be spherical or nearly spherical having an average particle diameter ranging from 0.02 to 0.1 µm.

(5) Polishing Cloth:

This polishing cloth comprises an abrasive layer, a surface of which is prohibited from eluting in the presence of an aqueous medium, until the abrasive layer is subjected to frictional stress, and is permitted to elute in the presence of an aqueous medium, when the abrasive layer is subjected to frictional stress.

In this case, the "frictional stress" means the force applied to the abrasive layer when a relative velocity between the abrasive layer and a subject member to be polished is set to 0.2 to 3.0 m/sec. under a condition where the subject member is permitted to contact the abrasive layer by applying a load of 150 to 500 gf/cm$^2$ to the subject member.

Specific examples of this polishing cloth include those consisting only of an abrasive layer, or those comprising a substrate made of a material selected from various kinds of material, such as metal, and the aforementioned abrasive layer which is deposited on the substrate.

The abrasive layer is formed of a material comprising a polymer material (especially, a homopolymer or a copolymer each having a repeating unit of monomer represented by the aforementioned formula (III), (IV), (V) or (VI)) that can be hydrolyzed by an aqueous medium as explained with reference to the aforementioned polishing cloth (1).

(6) Polishing Cloth:

This polishing cloth comprises an abrasive layer having dispersed therein at least one abrasive grain selected from the group consisting of cerium oxide, manganese oxide, silica, alumina and zirconia, wherein a surface portion of the abrasive layer is prohibited from eluting in the presence of an aqueous medium, until the abrasive layer is subjected to frictional stress, and is permitted to elute in the presence of an aqueous medium, when the abrasive layer is subjected to frictional stress, concomitantly permitting the abrasive grains to be supplied to the surface of the abrasive layer.

In this case, the "frictional stress" means the force applied the abrasive layer when a relative velocity between the abrasive layer and a subject member to be polished is set to 0.2 to 3.0 m/sec. under a condition where the subject member is permitted to contact the abrasive layer by applying a load of 150 to 500 gf/cm$^2$ to the subject member.

Specific examples of this polishing cloth include those consisting only of an abrasive layer containing the aforementioned abrasive grains, or those comprising a substrate made of a material selected from various kinds of material, such as metal, and the aforementioned abrasive layer containing the aforementioned abrasive grains, which is deposited on the substrate.

The abrasive layer is formed of not only a material comprising a polymer material (especially, a homopolymer or a copolymer each having a repeating unit of monomer represented by the aforementioned formula (III), (IV), (V) or (VI)) that can be hydrolyzed by an aqueous medium as explained with reference to the aforementioned polishing cloth (1) but also the aforementioned abrasive grains.

The abrasive grains should preferably be incorporated and dispersed uniformly in the abrasive layer at a ratio ranging from 0.5 to 20% by weight.

The abrasive grains should preferably be spherical or nearly spherical having an average particle diameter ranging from 0.02 to 0.1 µm.

Next, the polishing apparatus according to the present invention will be explained with reference to FIG. 1.

A turntable 1 is covered thereon with a polishing cloth 2. A supply pipe 3 for feeding a polishing slurry containing abrasive grains and water and optionally containing a surfactant and a dispersing agent if required, or a polishing composition not containing abrasive grains but containing water and optionally containing a surfactant and a dispersing agent if required, is disposed over the polishing cloth 2. A substrate holder 5 having a supporting shaft 4 on the top surface thereof is rotatively and vertically movably disposed over the polishing cloth 2.

The examples of the surfactant to be contained in the polishing slurry or in the polishing composition include for example a nonionic surfactant such as polyethylene glycolphenyl ether, ethylene glycol aliphatic acid ester, etc.; an amphoteric surfactant such as imidazolybetaine; an anionic surfactant such as sodium dodecyl sulfate; and a cationic surfactant such as stearin trimethyl ammonium chloride.

As for the polishing cloth, it is possible to employ those having the same structures as described in the aforementioned items (1) to (6). However, when the polishing cloths of the aforementioned items (1), (3) and (5) are to be employed in the polishing treatment of the subject member, a polishing slurry containing abrasive grains and water is fed from the feeding pipe 3 to the polishing cloth. On the other hand, when the polishing cloths of the aforementioned items (2), (4) and (6) are to be employed in the polishing treatment of the subject member, a polishing composition containing water and abrasive grain free and, if required, a surfactant and a dispersing agent is fed from the feeding pipe 3 to the polishing cloth. Next, a specific polishing method will be explained as follows.

(a) Polishing treatment by making use of a polishing apparatus provided with a polishing cloth having any one of the aforementioned structures (1), (3) and (5):

First of all, a subject member 6 to be polished, for example, a substrate, is held by making use of the holder 5 in such a way that the surface to be polished faces the polishing cloth 2. Then, while keeping the feeding of a polishing slurry 7 containing abrasive grains and water to the polishing cloth 2 from the feeding pipe 3, a desired magnitude of load is imposed on the subject member 6 so as to force the subject member 6 to contact the polishing cloth 2 by means of the supporting shaft 4. Concurrently, the holder 5 and the turntable 1 are caused to rotate in the same direction with each other. As a result of this, the surface to be polished of the subject member 6 is polished by the abrasive grains in the polishing slurry which has been fed to an interface between the subject member 6 and the polishing cloth 2.

(b) Polishing treatment by making use of a polishing apparatus provided with a polishing cloth having any one of the aforementioned structures (2), (4) and (6):

First of all, a subject member 6 to be polished, for example, a substrate, is held by making use of the holder 5 in such a way that the surface to be polished faces the polishing cloth 2. Then, while keeping the feeding of a polishing composition containing at least water and abrasive grain free to the polishing cloth 2 from the feeding pipe 3, a desired magnitude of load is imposed on the subject member 6 so as to force the subject member 6 to contact the polishing cloth 2 by means of the supporting shaft 4. Concurrently, the holder 5 and the turntable 1 are caused to rotate in the same direction with each other. On this occasion, the abrasive grains which are dispersed in the abrasive layer of the polishing cloth are permitted to be fed, due to the elution of the material of abrasive layer, to an interface between the face to be polished of the subject member 6 and the abrasive layer. As a result, the surface to be polished of the subject member 6 is polished by the abrasive grains that have been fed from the abrasive layer and in the presence of the polishing composition containing water that has been fed from the feeding pipe 3.

Next, the method of manufacturing a semiconductor device according to the present invention will be explained.

(A First Step)

At least one embedding portion selected from a groove and an opening is formed in the surface of a substrate, and a wiring material film made of copper or a copper alloy is deposited all over the surface including the embedding portion of the substrate.

As for the substrate, it is possible to employ for example a semiconductor substrate or a glass substrate.

This embedding portion can be formed in an insulating film formed on the substrate. As for specific examples of this insulating film, it is possible to employ, for example, a silicon oxide film, a boron-impregnated glass film (BPSG film), a phosphorus-impregnated glass film (PSG film), etc. This insulating film may be covered on the surface thereof with a polish-stopper film formed of a material selected from silicon nitride, carbon, alumina, boron nitride, diamond, etc.

As for the copper-based metal, it is possible to employ copper (Cu) or a copper alloy such as a Cu—Si alloy, a Cu—Al alloy, a Cu—Si—Al alloy, a Cu—Ag alloy, etc.

This wiring material film can be formed by means of sputter deposition, vacuum deposition or plating, for instance.

A conductivity barrier layer may be deposited on the insulating film including the embedding portion formed on the surface of semiconductor substrate prior to the deposition of the wiring material film on the insulating film. When such a conductivity barrier layer is deposited on the insulating film including the embedding portion, at least one buried conductive member selected from a wiring layer and a via-fill can be formed in the embedding portion surrounded by the conductivity barrier layer as a result of the polishing treatment to be carried out, as described later, subsequent to the deposition of the wiring material film. As a result, Cu employed as a conductive member can be prevented from being diffused into the insulating film by this conductivity barrier film, thus preventing the semiconductor substrate from being contaminated by Cu.

This conductivity barrier film may be formed of a single layer or a multi-layer made of a material selected from the group consisting for example of TiN, Ti, Nb, W, WN, TaN, TaSiN, Ta, Co, Zr, ZrN and CuTa. Preferably, this conductivity barrier film may be formed so as to have a thickness ranging from 15 to 50 nm.

(A Second Step)

The wiring material film formed on the substrate is subjected to a polishing treatment by making use of a polishing apparatus, thereby allowing the copper-based metal to be buried inside the embedding portion, thus forming a buried conductive member such as a buried wiring layer which is made of copper or a copper alloy for instance.

Specifically, the buried conductive member can be formed by way of the following methods.

(a) First of all, a semiconductor substrate 6 employed as a subject member to be polished is held by making use of the holder 5 in such a way that the wiring material film made of copper or a copper alloy is enabled to face the polishing cloth (a polishing cloth having any one of the aforementioned structures (1), (3) and (5)) 2. Then, while keeping the feeding of a polishing slurry 7 containing abrasive grains and water to the polishing cloth 2 from the feeding pipe 3, a desired magnitude of load is imposed on the semiconductor substrate 6 so as to force the semiconductor substrate 6 to contact the polishing cloth 2 by means of the supporting shaft 4. Concurrently, the holder 5 and the turntable 1 are caused to rotate in the same direction with each other. As a result of this, the wiring material film of the semiconductor substrate 6 is polished mainly by the abrasive grains in the polishing slurry which has been fed to an interface between the wiring material film and the polishing cloth 2, thereby forming a buried conductive member wherein copper or a copper alloy is embedded inside the embedding portion.

(b) First of all, a semiconductor substrate 6 employed as a subject member to be polished is held by making use of the holder 5 in such a way that the wiring material film made of copper or a copper alloy is enabled to face the polishing cloth (a polishing cloth having any one of the aforementioned structures (2), (4) and (6)) 2. Then, while keeping the feeding of a polishing composition containing at least water and abrasive grain free to the polishing cloth 2 from the feeding pipe 3, a desired magnitude of load is imposed on the semiconductor substrate 6 so as to force the semiconductor substrate 6 to contact the polishing cloth 2 by means of the supporting shaft 4. Concurrently, the holder 5 and the turntable 1 are caused to rotate in the same direction with each other. On this occasion, the abrasive grains dispersed in the abrasive layer of the polishing cloth may enter, due to the elution of the material of abrasive layer, an interface between the wiring material film of the substrate 6 and the abrasive layer. As a result, the wiring material film of the substrate 6 is polished by the abrasive grains that have been fed from the abrasive layer and in the presence of the polishing composition containing water that has been fed from the feeding pipe 3, thereby forming a buried conductive member wherein copper or a copper alloy is embedded inside the embedding portion.

The aforementioned polishing slurry or polishing composition may further contain a water-soluble organic acid (first organic acid) capable of reaction with copper to produce a copper complex compound which is substantially insoluble in water and has a mechanical strength lower than that of copper and an oxidizing agent.

Specific examples of this first organic acid include for example 2-quinoline carboxylic acid (quinaldinic acid), 2-pyridine carboxylic acid, 2,6-pyridine carboxylic acid, quinolinic acid, etc.

The mixing ratio of this first organic acid in the polishing slurry or polishing composition should preferably be 0.1% by weight or more. Further, if the mixing ratio of this first organic acid is less than 0.1% by weight, it may become difficult to sufficiently generate the copper complex which has a mechanical strength lower than that of copper on the surface of the Cu or Cu alloy film. As a result, it may become difficult to sufficiently promote the polishing rate of the Cu or Cu alloy film at the polishing step thereof. A more preferable mixing ratio of this first organic acid would be in the range of 0.3 to 1.2% by weight.

The aforementioned oxidizing agent is effective in generating copper hydrate when the polishing slurry or polishing composition contacts the Cu or Cu alloy film. Specific examples of this oxidizing agent are hydrogen peroxide ($H_2O_2$), sodium hypochlorite (NaClO), etc.

The mixing ratio of this oxidizing agent in the polishing slurry or polishing composition should preferably be at least ten times (based on weight) as much as that of the first organic acid. Because, if the mixing ratio of this oxidizing agent is less than ten times (based on weight) relative to the first organic acid, it may become difficult to sufficiently promote the generation of the copper complex on the surface of the Cu or Cu alloy film. A more preferable mixing ratio of this oxidizing agent relative to the first organic acid would be not less than 30 times (based on weight), more preferably not less than 50 times (based on weight) relative to the first organic acid.

The aforementioned polishing slurry or polishing composition may further contain an organic acid (a second organic acid) having one carboxylic group and one hydroxyl group.

The aforementioned second organic acid is effective in promoting the aforementioned effect of the oxidizing agent to generate copper hydrate. Specific examples of this second organic acid include lactic acid, tartaric acid, mandelic acid, malic acid, etc. These acids may be employed singly or in combination of two or more kinds. Among these acids, lactic acid is most preferable.

The mixing ratio of this second organic acid in the polishing slurry or polishing composition should preferably be confined within the range of 20 to 250% by weight based on the weight of the first organic acid. Because, if the mixing ratio of this second organic acid is less than 20% by weight, it may become difficult to sufficiently promote the effect of the oxidizing agent to generate copper hydrate. On the other hand, if the mixing ratio of this second organic acid exceeds 250% by weight, the wiring material film formed of copper or a copper alloy may be etched away, thereby making it impossible to form a wiring pattern. A more preferable mixing ratio of this second organic acid would be in the range of 40 to 200% by weight based on the weight of the first organic acid.

As explained above, the polishing cloth [polishing cloth (1)] according to the present invention comprises an abrasive layer containing a polymer material which is a hydrolyzable with an aqueous medium.

As a polishing slurry containing abrasive grains and water is fed to the polishing cloth constructed as described above with this polishing cloth being kept rotating while pressing the subject member onto the polishing cloth, the polishing surface of the subject member is polished mainly by the abrasive grains in the polishing slurry which has been fed to an interface between the subject member and the polishing cloth. On this occasion, since the polishing cloth contains a polymer material that is a hydrolyzable with an aqueous medium, a region of the abrasive layer to which a mechanical force is locally imparted by the sliding-contact under pressure of subject member is permitted to hydrolyze and dissolve by the water included in the polishing slurry being fed thereto, thus enabling the surface of the polishing cloth to be always renewed. Therefore, it is now possible to prevent the abrasive grains in the polishing slurry from being accumulated and enlarged on the surface (abrasive surface) of the polishing cloth. As a result, the polishing cloth is enabled to exhibit a satisfactory polishing performance which is almost equivalent to the initial polishing performance (the polishing rate will be decreased more or less as compared with that of the initial polishing period) for a relatively long period of time without necessitating the surface-regenerating operation that has been conventionally performed after the polishing treatment and prior to the next polishing treatment of the subject member by making use of a dressing tool of dressing apparatus. Thus, it is now possible to provide a polishing cloth which is capable of stably polishing a subject member for a long period of time without necessitating a dressing treatment.

In particular, when the polymer material constituting a main component of the abrasive layer is formed of a homopolymer or a copolymer each having a repeating unit of monomer represented by the aforementioned formula (III) or (IV) (silyl acrylate or silyl methacrylate) or formed of a homopolymer or a copolymer each having a repeating unit of monomer represented by the aforementioned formula (V) or (VI) (hemiacetal acrylate or hemiacetal methacrylate), the solubility through hydrolysis of the polishing cloth can be further enhanced, thus making it possible to further improve the efficiency of renewal of the surface of polishing cloth.

Namely, the homopolymer or the copolymer each having a repeating unit of monomer represented by the aforementioned formula (III), (IV), (V) or (VI) has a silyl ester group or hemiacetal ester group each bonded to the backbone chain thereof, so that when these esters hydrolyze, free hydrophilic carboxyl group is caused to regenerate, thereby making it possible to more smoothly dissolve the surface of the polishing cloth and hence further promote the renewal of the surface of polishing cloth.

Further, when the particles of substance (for example, rosin) which is higher in solubility than that of the polymer material is dispersed in the polishing cloth, the dissolution originating from each of the particles will be proceeded, thereby making it possible to further promote the renewal of the surface of polishing cloth.

Another kind of polishing cloth [polishing cloth (2)] according to the present invention comprises an abrasive layer containing a polymer material which is a hydrolyzable with an aqueous medium and at least one abrasive grain selected from the group consisting of cerium oxide, manganese oxide, silica, alumina and zirconia, this abrasive grain being dispersed in the polymer material.

As a polishing composition not containing water and abrasive grain free is fed to the polishing cloth constructed as described above with this polishing cloth being kept rotating while pressing the subject member onto the polishing cloth, since the polishing cloth contains a polymer material that is a hydrolyzable with an aqueous medium, a region of the abrasive layer to which a mechanical force is locally imparted by the sliding-contact under pressure of subject member is hydrolyzed and eluted by the water included in the polishing composition being fed thereto. As a result, the abrasive grains that have been dispersed in the polishing cloth are permitted to enter an interface between the subject member and the polishing cloth, thus allowing the abrasive grains to be automatically fed to the aforementioned interface to thereby enable the polishing surface of the subject member to be polished mainly by the abrasive grains. Further, since the polishing cloth can be dissolved through the hydrolysis thereof and the surface of the polishing cloth can be always renewed, it is now possible to prevent the abrasive grains from being accumulated and enlarged on the surface of the polishing cloth. As a result, the polishing cloth is enabled to exhibit a satisfactory polishing performance which is almost equivalent to the initial polishing performance (the polishing rate will be decreased more or less as compared with that of the initial polishing period) for a relatively long period of time without necessitating the surface-regenerating operation that has been conventionally performed after the polishing treatment and prior to the next polishing treatment of the subject member by making use of a dressing tool of a dressing apparatus. Thus, it is now possible to provide a polishing cloth which is capable of stably polishing a subject member for a long period of time without necessitating a dressing treatment.

In particular, when the polymer material constituting a main component of the abrasive layer is formed of a homopolymer or a copolymer each having a repeating unit of a monomer represented by the aforementioned formula (III) or (IV) (silyl acrylate or silyl methacrylate) or formed of a homopolymer or a copolymer each having a repeating unit of monomer represented by the aforementioned formula (V) or (VI) (hemiacetal acrylate or hemiacetal methacrylate), the solubility through hydrolysis of the polishing cloth can be further enhanced, thus making it possible to smoothly feed the abrasive grains from the polishing cloth and, at the same time, to further improve the efficiency of renewal of the surface of the polishing cloth.

Further, when the particles of a substance (for example, rosin) which is higher in solubility than that of the polymer material are dispersed in the polishing cloth, the dissolution originating from each of the particles will be proceeded, thereby making it possible to more smoothly feed the abrasive grains from the polishing cloth and, at the same time, to further promote the renewal of the surface of the polishing cloth.

Another kind of polishing cloth [polishing cloth (3)] according to the present invention comprises an abrasive layer containing a polymer material which is a soluble in an aqueous medium.

As a polishing slurry containing abrasive grains and water is fed to the polishing cloth constructed as described above with this polishing cloth being kept rotating while pressing the subject member onto the polishing cloth, the polishing surface of the subject member is polished mainly by the abrasive grains in the polishing slurry which have been fed to an interface between the subject member and the polishing cloth. On this occasion, since the polishing cloth contains a polymer material that is a soluble in an aqueous medium, a region of the abrasive layer to which a mechanical force is locally imparted by the sliding-contact under pressure of subject member is permitted to dissolve by the water included in the polishing slurry being fed thereto, thus enabling the surface of the polishing cloth to be always renewed. Therefore, it is now possible to prevent the abrasive grains in the polishing slurry from being accumulated and enlarged on the surface (abrasive surface) of the polishing cloth. As a result, the polishing cloth is enabled to exhibit a satisfactory polishing performance which is almost equivalent to the initial polishing performance (the polishing rate will be decreased more or less as compared with that of the initial polishing period) for a relatively long period of time without necessitating the surface-regenerating operation that has been conventionally performed after the polishing treatment and prior to the next polishing treatment of the subject member by making use of a dressing tool of dressing apparatus. Thus, it is now possible to provide a polishing cloth which is capable of stably polishing a subject member for a long period of time without necessitating a dressing treatment.

In particular, when the polymer material constituting a main component of the abrasive layer is formed of a material that is a soluble in an aqueous medium at a rate of 0.01 to 10.0 mg/min. as a relative velocity between the abrasive layer and the subject member to be polished is set to 1.0 m/sec. under a condition where the subject member is permitted to contact the abrasive layer by applying a load of 300 gf/cm$^2$ to the subject member, the solubility of the polishing cloth during the polishing procedure can be further enhanced, thus making it possible to further improve the efficiency of renewal of the surface of the polishing cloth.

Another kind of polishing cloth [polishing cloth (4)] according to the present invention comprises an abrasive layer containing a polymer material which is a soluble in an aqueous medium and at least one abrasive grain selected from the group consisting of cerium oxide, manganese oxide, silica, alumina and zirconia, this abrasive grain being dispersed in the polymer material.

As a polishing composition not containing water and abrasive grain free is fed to the polishing cloth constructed as described above with this polishing cloth being kept rotating while pressing the subject member onto the polishing cloth, since the polishing cloth contains a polymer material that is a soluble in an aqueous medium, a region of the abrasive layer to which a mechanical force imparted by the slide-contact of the subject member is caused to elute by the water included in the polishing composition being fed thereto. As a result, the abrasive grains that have been dispersed in the polishing cloth are permitted to enter an interface between the subject member and the polishing cloth, thus allowing the abrasive grains to be automatically fed to the aforementioned interface to thereby enable the polishing surface of the subject member to be polished mainly by the abrasive grains. Further, since the polishing cloth can be dissolved in water and the surface of the polishing cloth can be always renewed, it is now possible to prevent the abrasive grains from being accumulated and enlarged on the surface of the polishing cloth. As a result, the polishing cloth is enabled to exhibit a satisfactory polishing performance which is almost equivalent to the initial polishing performance (the polishing rate will be decreased more or less as compared with that of the initial polishing period) for a relatively long period of time without necessitating the surface-regenerating operation that has been conventionally performed after the polishing treatment and prior to the next polishing treatment of the subject member by making use of a dressing tool of dressing apparatus. Thus, it is now possible to provide a polishing cloth which is capable of stably polishing a subject member for a long period of time without necessitating a dressing treatment.

In particular, when the polymer material constituting a main component of the abrasive layer is formed of a material that is a soluble in an aqueous medium at a rate of 0.01 to 10.0 mg/min. as a relative velocity between the abrasive layer and the subject member to be polished is set to 1.0 m/sec. under a condition where the subject member is permitted to contact the abrasive layer by applying a load of 300 gf/cm$^2$ to the subject member, the solubility of the polishing cloth during the polishing procedure can be further enhanced, thus making it possible to more smoothly feed the abrasive grains from the polishing cloth and, at the same time, to further improve the efficiency of renewal of the surface of the polishing cloth.

Another kind of polishing cloth [polishing cloth (5)] according to the present invention comprises an abrasive layer, a surface of which is prohibited from eluting in the presence of an aqueous medium, until the abrasive layer is subjected to frictional stress, and is permitted to elute in the presence of an aqueous medium, when the abrasive layer is subjected to frictional stress.

As a polishing slurry containing abrasive grains and water is fed to the polishing cloth constructed as described above with this polishing cloth being kept rotating while pressing the subject member onto the polishing cloth, the polishing surface of the subject member is polished mainly by the abrasive grains in the polishing slurry which has been fed to an interface between the subject member and the polishing cloth. On this occasion, a region of the abrasive layer which is received a mechanical force (frictional force or stress) imparted by pressurizing to subject member and the slide-contact of the subject member is caused to elute in the presence of the water included in the polishing slurry being fed thereto, thus enabling the surface of the polishing cloth to be always renewed. Therefore, it is now possible to prevent the abrasive grains in the polishing slurry from being accumulated and enlarged on the surface (abrasive surface) of the polishing cloth. As a result, the polishing cloth is enabled to exhibit a satisfactory polishing performance which is almost equivalent to the initial polishing performance (the polishing rate will be decreased more or less as compared with that of the initial polishing period) for a relatively long period of time without necessitating the surface-regenerating operation that has been conventionally performed after the polishing treatment and prior to the next polishing treatment of the subject member by making use of a dressing tool of dressing apparatus. Thus, it is now possible to provide a polishing cloth which is capable of stably polishing a subject member for a long period of time without necessitating a dressing treatment.

Another kind of polishing cloth [polishing cloth (6)] according to the present invention comprises, at least on one side thereof which is designed to be in contact with the subject member to be polished, an abrasive layer having dispersed therein at least one abrasive grain selected from the group consisting of cerium oxide, manganese oxide, silica, alumina and zirconia. A surface portion of the abrasive layer is prohibited from eluting in the presence of an aqueous medium, until the abrasive layer is subjected to frictional stress, and is permitted to elute in the presence of an aqueous medium, when the abrasive layer is subjected to frictional stress, concomitantly permitting the abrasive grain to be supplied to the surface of the abrasive layer.

As a polishing composition not containing water and abrasive grain free is fed to the polishing cloth constructed as described above with this polishing cloth being kept rotating while pressing the subject member onto the polishing cloth, a region of the abrasive layer which is received a mechanical force (frictional stress) imparted by pressurizing to the subject member and the slide-contact of the subject member is caused to elute in the presence of the water included in the polishing composition being fed thereto. As a result, the abrasive grains that have been dispersed in the polishing cloth are permitted to enter an interface between the subject member and the polishing cloth, thus allowing the abrasive grains to be automatically fed to the aforementioned interface to thereby enable the polishing surface of the subject member to be polished mainly by the abrasive grains. Further, since the polishing cloth can be eluted in the presence of water due to the effect of aforementioned frictional stress and the surface of the polishing cloth can be always renewed, it is now possible to prevent the abrasive grains from being accumulated and enlarged on the surface of the polishing cloth. As a result, the polishing cloth is enabled to exhibit a satisfactory polishing performance which is almost equivalent to the initial polishing performance (the polishing rate will be decreased more or less as compared with that of the initial polishing period) for a relatively long period of time without necessitating the surface-regenerating operation that has been conventionally performed after the polishing treatment and prior to the next polishing treatment of the subject member by making use of a dressing tool of a dressing apparatus. Thus, it is now possible to provide a polishing cloth which is capable of stably polishing a subject member for a long period of time without necessitating a dressing treatment.

A polishing apparatus according to one embodiment of the present invention comprises: a turntable having a surface which is covered with a polishing cloth having an abrasive layer which is constituted by any one of the aforementioned structures (1), (3) and (5); holding means which is rotatively and vertically movably disposed over the turntable and is designed to hold a subject member to be polished, the holding means being also designed to impose a desired magnitude of load on the subject member to thereby enable the subject member to be press-contacted with the abrasive cloth of the turntable, and further designed to rotate in the same direction as that of the turntable; and feeding means for feeding a polishing slurry containing abrasive grains to the polishing cloth. Due to the effect of the abrasive cloth having any one of the aforementioned structures (1), (3) and (5), this polishing apparatus is capable of stably polishing a subject member for a long period of time without necessitating a dressing treatment.

A polishing apparatus according to another embodiment of the present invention comprises: a turntable having a surface which is covered with a polishing cloth having an abrasive layer which is constituted by any one of the aforementioned structures (2), (4) and (6) and contains at least one kind of abrasive grain selected from the group consisting of cerium oxide, manganese oxide, silica, alumina and zirconia; holding means which is rotatively and vertically movably disposed over the turntable and is designed to hold a subject member to be polished, the holding means being also designed to impose a desired magnitude of load on the subject member to thereby enable the subject member to be press-contacted with the abrasive cloth of the turntable, and further designed to rotate in the same direction as that of the turntable; and feeding means for feeding a polishing composition containing at least water and abrasive grain free to the polishing cloth. Due to the effect of the abrasive cloth having any one of the aforementioned structures (2), (4) and (6), this polishing apparatus is capable of automatically feeding abrasive grains to the polishing surface and also capable of stably polishing a subject member for a long period of time without necessitating a dressing treatment.

A method for manufacturing a polishing apparatus according to another embodiment of the present invention comprises the steps of: forming at least one embedding portion selected from a groove corresponding to a configuration of a wiring layer and an opening corresponding to a configuration of a via-fill in an insulating film deposited on a semiconductor substrate; forming a wiring material film made of copper or copper alloy on a surface of the insulating film including the inner surface of the embedding portion; and polishing the wiring material film by making use of a polishing apparatus which is furnished therein with a polishing cloth selected from any one of the aforementioned structures (1) to (6), thereby forming at least one conductive member selected from a wiring layer and a via-fill in the embedding portion.

According to this method, since the wiring material film is designed to be polished by a simplified procedure employing a polishing apparatus which is provided with a polishing cloth which is capable of retaining a stable polishing performance without necessitating the aforementioned dressing, it is now possible to mass-produce a semiconductor device wherein a conductive member such as a wiring layer having a desired film thickness is buried in the embedding portion.

Next, examples of the present invention will be explained in detail.

SYNTHESIS EXAMPLE 1

First of all, 40.0 parts by weight of xylene, and 10.0 parts by weight of butyl acetate were introduced into a flask with a stirrer, and the resultant mixture was heated up to a temperature of 134° C. Thereafter, a mixed solution comprising 60.0 parts by weight of tri-iso-propylsilyl acrylate (the compound represented by the aforementioned formula (III-4)), 15.0 parts by weight of 2-ethoxyethyl methacrylate, 20.0 parts by weight of methyl methacrylate, 5.0 parts by weight of n-butyl methacrylate and 1.0 part by weight of a polymerization catalyst or perbutyl I (trade name, NOF CORPORATION; t-butyl peroxyisopropyl carbonate) was added dropwise with stirring to the aforementioned mixture in the flask over a period of 3 hours. After finishing this addition, the resultant mixture was maintained at this temperature for 30 minutes to obtain a reaction mixture. Then, a mixture consisting of 10.0 parts by weight of xylene, and 1.0 part by weight of perbutyl I was added dropwise to the aforementioned reaction mixture over a period of 20 minutes, and the resultant mixture was stirred for 2 hours while maintaining this temperature to accomplish the polymerization reaction. Finally, the resultant reaction mixture was diluted by adding thereto 48.0 parts by weight of xylene to obtain a 50% xylene solution of a copolymer having a repeating unit of silyl acrylate having a structural formula represented by the following formula (X).

Incidentally, the number average molecular weight of the copolymer obtained in this manner was 67,000, and glass transition temperature thereof was 56° C. Further, the ratio of the repeating unit of this silyl acrylate based on the entire weight of this copolymer was 60% by weight.

hemiacetal methacrylate having a structural formula represented by the following formula (XI).

Incidentally, the number average molecular weight of the copolymer obtained in this manner was 38,000, and glass transition temperature thereof was 50° C. Further, the ratio of the repeating unit of this hemiacetal methacrylate based on the entire weight of this copolymer was 43.7% by weight.

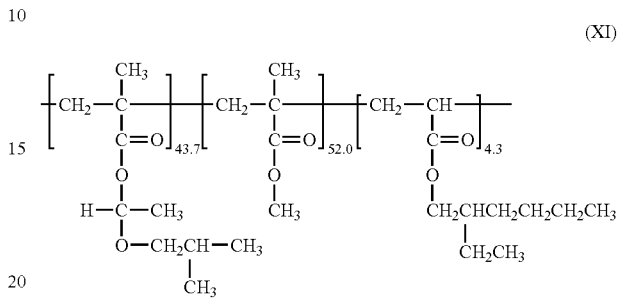

(XI)

(the composition ratios shown in this formula XI are based on weight %)

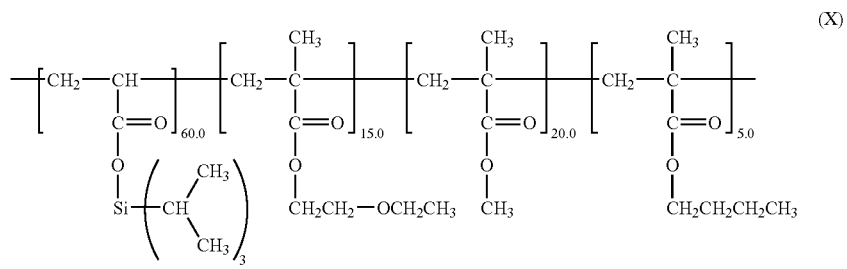

(X)

(the composition ratios shown in this formula X are based on weight %)

SYNTHESIS EXAMPLE 2

First of all, 40.0 parts by weight of xylene, and 10.0 parts by weight of butyl acetate were introduced into a flask with a stirrer, and the resultant mixture was heated up to a temperature of 134° C. Thereafter, a mixed solution comprising 43.7 parts by weight of 1-iso-butoxyethyl methacrylate (the compound represented by the aforementioned formula (VI-6)), 52.0 parts by weight of methyl methacrylate, 4.3 parts by weight of 2-ethylhexyl acrylate and 1.0 part by weight of a polymerization catalyst or perbutyl I was added dropwise with stirring to the aforementioned mixture in the flask over a period of 3 hours. After finishing this addition, the resultant mixture was maintained at this temperature for 30 minutes to obtain a reaction mixture. Then, a mixture consisting of 10.0 parts by weight of xylene, and 1.0 part by weight of perbutyl I was added dropwise to the aforementioned reaction mixture over a period of 20 minutes, and the resultant mixture was stirred for 2 hours while maintaining this temperature to accomplish the polymerization reaction. Finally, the resultant reaction mixture was diluted by adding thereto 48.0 parts by weight of xylene to obtain a 50% xylene solution of a copolymer having a repeating unit of

SYNTHESIS EXAMPLE 3

First of all, 40.0 parts by weight of xylene, and 10.0 parts by weight of butyl acetate were introduced into a flask with a stirrer, and the resultant mixture was heated up to a temperature of 134° C. Thereafter, a mixed solution comprising 64.0 parts by weight of acrylic acid, 36.0 parts by weight of methoxyethyl acrylate and 1.0 part by weight of a polymerization catalyst or perbutyl I was added dropwise with stirring to the aforementioned mixture in the flask over a period of 3 hours. After finishing this addition, the resultant mixture was maintained at this temperature for 30 minutes to obtain a reaction mixture. Then, a mixture consisting of 10.0 parts by weight of xylene, and 1.0 part by weight of perbutyl I was added dropwise to the aforementioned reaction mixture over a period of 20 minutes, and the resultant mixture was stirred for 2 hours while maintaining this temperature to accomplish the polymerization reaction.

Finally, the resultant reaction mixture was diluted by adding thereto 48.0 parts by weight of xylene to obtain a 50% xylene solution of a polymer which was soluble in an aqueous medium.

Incidentally, the number average molecular weight of the polymer obtained in this manner was 21,000, and glass transition temperature thereof was 35° C.

SYNTHESIS EXAMPLE 4

First of all, 40.0 parts by weight of xylene, and 10.0 parts by weight of butyl acetate were introduced into a flask with a stirrer, and the resultant mixture was heated up to a temperature of 134° C. Thereafter, a mixed solution comprising 15.0 parts by weight of methyl methacrylate acid, 85.0 parts by weight of butyl methacrylate and 1.0 part by weight of a polymerization catalyst or perbutyl I was added dropwise with stirring to the aforementioned mixture in the flask over a period of 3 hours. After finishing this addition, the resultant mixture was maintained at this temperature for 30 minutes to obtain a reaction mixture. Then, a mixture consisting of 10.0 parts by weight of xylene, and 1.0 part by weight of perbutyl I was added dropwise to the aforementioned reaction mixture over a period of 20 minutes, and the resultant mixture was stirred for 2 hours while maintaining this temperature to accomplish the polymerization reaction.

Finally, the resultant reaction mixture was diluted by adding thereto 48.0 parts by weight of xylene to obtain a 50% xylene solution of a polymer, the surface of which was enabled to elute in an aqueous medium as the polymer was subjected to a frictional stress.

Incidentally, the number average molecular weight of the polymer obtained in this manner was 17,000, and glass transition temperature thereof was 44° C.

EXAMPLE 1

Cerium oxide abrasive grains having an average particle diameter of 0.2 μm were dispersed in pure water at a ratio of 0.5% by weight to prepare a polishing slurry.

Further, a 50% xylene solution of the copolymer having a structural formula represented by the formula (X) that had been synthesized in the aforementioned Synthesis Example 1 was cast on the surface of a turntable and then dried to obtain a polishing cloth having a thickness of 50 μm and constituted by the aforementioned copolymer. The turntable covered with this polishing cloth was then integrated into the aforementioned polishing apparatus shown in FIG. 1.

Then, a 20 mm square silicon substrate having a silicon oxide film formed thereon was prepared. Then, this silicon substrate 6 was secured to the holder 5 of the polishing apparatus shown in FIG. 1 in such a manner that the silicon oxide film thereof faced the polishing cloth 2 formed on the surface of the turntable 1. Thereafter, by means of the supporting shaft 4 of holder 5, the wafer 6 made of contact the polishing cloth 2 formed on the turntable 1 by applying a load of about 300 g/cm$^2$ to the wafer 6, while the turntable 1 and the holder 5 rotate in the same direction with each other at a rotational speed of 100 rpm and 103 rpm, respectively, and the polishing slurry was fed from the supply pipe 3 to the polishing cloth 2 at a flow rate of 20 mL/min., thereby polishing the silicon oxide film formed on the surface of the silicon substrate 6 for a period of 60 minutes.

COMPARATIVE EXAMPLE 1

The silicon oxide film formed on the surface of the silicon substrate 6 was polished for a period of 60 minutes under the same conditions as described in Example 1 except that rigid polyurethane foam (IC1000 (trade name); Rodel Co., Ltd.) was employed as a polishing cloth to be integrated into the polishing apparatus.

Figure 2:
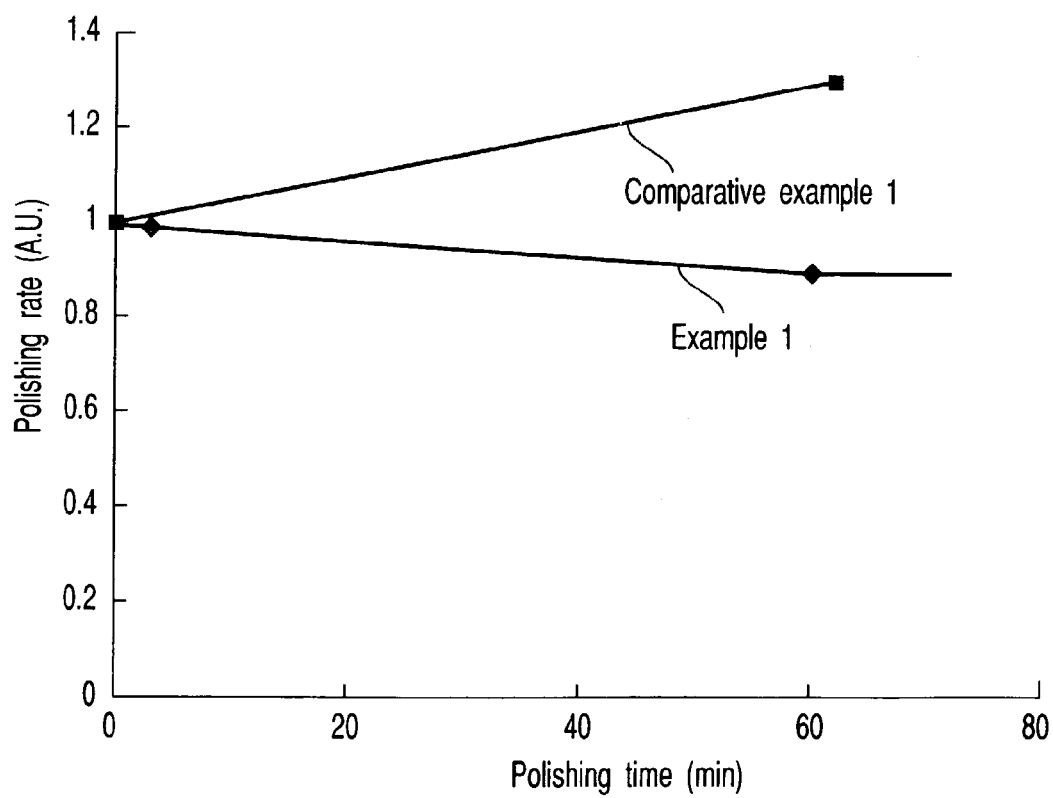
FIG. 2 is a graph illustrating the relationship between the polishing time and the polishing rate on the occasions when a silicon oxide film is polished by making use of the polishing apparatuses of Example 1 and Comparative Example 1.

The polishing time and the polishing rate of the silicon oxide film in Example 1 as well as in Comparative Example 1 were measured, the results being shown in FIG. 2.

As apparent from FIG. 2, in the case of Comparative Example 1 wherein the silicon oxide film formed on the silicon substrate was polished using a polishing apparatus provided with the conventional polishing cloth which was formed of rigid polyurethane foam, the polishing rate was increased in proportion with the lapse of polishing time. More specifically, the polishing rate was increased by 30% over the initial polishing rate as the polishing time was continued for 60 minutes, thus indicating the fluctuation of the polishing rate.

By contrast, in the case of Example 1 wherein the silicon oxide film formed on the silicon substrate was polished using a polishing apparatus provided with a polishing cloth which was formed of a copolymer having a structural formula shown in the aforementioned formula (X), although the polishing rate was increased more or less in proportion with the lapse of polishing time, the polishing rate was increased only by 10% over the initial polishing rate as the polishing time was continued for 60 minutes, thus indicating a relatively stable polishing rate.

EXAMPLE 2

A 50% xylene solution of the copolymer having a structural formula represented by the formula (XI) that had been synthesized in the aforementioned Synthesis Example 2 was cast on the surface of a turntable and then dried to obtain a polishing cloth having a thickness of 50 μm and constituted by the aforementioned copolymer. The turntable covered with this polishing cloth was then integrated into the aforementioned polishing apparatus shown in FIG. 1.

Then, a 20 mm square silicon substrate having a silicon oxide film formed thereon was prepared. Then, this silicon substrate 6 was secured to the holder 5 of the polishing apparatus shown in FIG. 1 in such a manner that the silicon oxide film thereof faced the polishing cloth 2 formed on the surface of the turntable 1. Thereafter, the silicon oxide film formed on the surface of the silicon substrate 6 was polished in the same manner as described in Example 1.

Further, the dressing for conditioning the state of the surface of polishing cloth was performed by making use of a #80 diamond electrodeposition dresser and under the conditions of 200 g/cm$^2$ in load and 160 rpm in rotational speed of the turntable.

As a result, it was confirmed that it was possible, by performing the aforementioned dressing for 5 minutes or more in advance, to carry out a stable polishing of the silicon oxide film at a polishing rate of about 40 nm/min.

EXAMPLE 3

A 50% xylene solution of the copolymer (a copolymer of methyl methacrylate/butyl methacrylate) that had been synthesized in the aforementioned Synthesis Example 4, i.e. the polymer whose surface was eluted in an aqueous medium as it was subjected to a frictional stress, was coated on the abrasive surface of IC1000/Suba-400 (trade name, Rodel Co., Ltd.) and then dried to obtain a polishing cloth having a thickness of 85 μm. The turntable covered with this polishing cloth was then integrated into the aforementioned polishing apparatus shown in FIG. 1.

Then, a 20 mm square silicon substrate having a silicon oxide film (P-TEOS film) formed thereon was prepared. Then, this silicon substrate 6 was secured to the holder 5 of the polishing apparatus shown in FIG. 1 in such a manner that the silicon oxide film thereof faced the polishing cloth 2 formed on the surface of the turntable 1. Thereafter, by means of the supporting shaft 4 of holder 5, the wafer 6 was made to contact the polishing cloth 2 formed on the turntable 1 by applying a load of about 300 g/cm² to the wafer 6, while the turntable 1 and the holder 5 were rotate in the same direction, at rotational speeds of 50 rpm and 160 rpm, respectively, the polishing slurry comprising pure water, and 1% by weight of cerium oxide abrasive grains having an average particle diameter of 0.2 µm and dispersed in pure water was fed from the supply pipe 3 to the polishing cloth 2 at a flow rate of 20 mL/min., thereby polishing the silicon oxide film formed on the surface of the silicon substrate 6.

Further, the dressing for conditioning the state of the surface of polishing cloth was performed by making use of a #80 diamond electrodeposition dresser and under the conditions of 200g/cm² in load and 160 rpm in rotational speed of the turntable.

As a result, it was confirmed that it was possible, by performing the aforementioned dressing for 5 minutes or more in advance, to carry out a stable polishing of the silicon oxide film at a polishing rate of about 40 nm/min.

EXAMPLE 4

A 50% xylene solution of the copolymer (a copolymer of acrylic acid/methoxy acrylate) that had been synthesized in the aforementioned Synthesis Example 3, i.e. the polymer which was soluble in an aqueous medium, was coated on the abrasive surface of IC1000/Suba-400 (trade name, Rodel Co., Ltd.) to a thickness of 55 µm and then dried to obtain a polishing cloth. The turntable covered with this polishing cloth was then integrated into the aforementioned polishing apparatus shown in FIG. 1.

Then, a 25 mm square silicon substrate having a silicon oxide film (P-TEOS film) formed thereon was prepared. Then, this silicon substrate 6 was secured to the holder 5 of the polishing apparatus shown in FIG. 1 in such a manner that the silicon oxide film thereof faced the polishing cloth 2 formed on the surface of the turntable 1. Thereafter, in the same manner as described in Example 3, the silicon oxide film formed on the surface of the silicon substrate 6 was polished.

Further, the dressing for conditioning the state of the surface of polishing cloth was performed by making use of a #80 diamond electrodeposition dresser and under the conditions of 200 g/cm² in load and 160 rpm in rotational speed of the turntable.

As a result, it was confirmed that it was possible, by performing the aforementioned dressing for 5 minutes or more in advance, to carry out a stable polishing of the silicon oxide film at a polishing rate of about 50 nm/min.

EXAMPLE 5

A 50% xylene solution of the copolymer that had been synthesized in the aforementioned Synthesis Example 2, i.e. the copolymer having a repeating unit of hemiacetal methacrylate, was coated on the abrasive surface of IC1000/Suba-400 (trade name, Rodel Co., Ltd.) to a thickness of 70 µm and then dried to obtain a polishing cloth. The turntable covered with this polishing cloth was then integrated into the aforementioned polishing apparatus shown in FIG. 1.

Then, a 25 mm square silicon substrate having a silicon oxide film (P-TEOS film) formed thereon was prepared. Then, this silicon substrate 6 was secured to the holder 5 of the polishing apparatus shown in FIG. 1 in such a manner that the silicon oxide film thereof faced the polishing cloth 2 formed on the surface of the turntable 1. Thereafter, in the same manner as described in Example 3, the silicon oxide film formed on the surface of the silicon substrate 6 was polished.

Further, the dressing for conditioning the state of the surface of polishing cloth was performed by making use of a #80 diamond electrodeposition dresser and under the conditions of 200 g/cm² in load and 160 rpm in rotational speed of the turntable.

As a result, it was confirmed that it was possible, by performing the aforementioned dressing for 5 minutes or more in advance, to carry out a stable polishing of the silicon oxide film at a polishing rate of about 50 nm/min.

EXAMPLE 6

A 50% xylene solution of the copolymer having a repeating unit of silyl acrylate and synthesized in the aforementioned Synthesis Example 1, the xylene solution also containing 3% by weight (based on the copolymer) of cerium oxide abrasive grains 0.2 µm in average particle diameter, was coated on the abrasive surface of IC1000/Suba-400 (trade name, Rodel Co., Ltd.) to a thickness of about 50 µm and then dried to obtain a polishing cloth. The turntable covered with this polishing cloth was then integrated into the aforementioned polishing apparatus shown in FIG. 1.

Then, a 25 mm square silicon substrate having a silicon oxide film (P-TEOS film) formed thereon was prepared. Then, this silicon substrate 6 was secured to the holder 5 of the polishing apparatus shown in FIG. 1 in such a manner that the silicon oxide film thereof faces the polishing cloth 2 formed on the surface of the turntable 1. Thereafter, by means of the supporting shaft 4 of holder 5, the silicon substrate 6 was made to contact the polishing cloth 2 formed on the turntable 1 by applying a load of about 300 g/cm² to the silicon substrate 6, while the turntable 1 and the holder 5 were rotated in the same direction, at rotational speeds of 50 rpm and 160 rpm, respectively, a 4.3 wt % aqueous solution of hydrogen peroxide (polishing composition) was fed from the supply pipe 3 to the polishing cloth 2 at a flow rate of 20 mL/min., thereby polishing the silicon oxide film formed on the surface of the silicon substrate 6.

Further, the dressing for conditioning the state of the surface of polishing cloth was performed by making use of a #80 diamond electrodeposition dresser and under the conditions of 200 g/cm² in load and 160 rpm in rotational speed of the turntable.

As a result, it was confirmed that, in spite of the fact that the polishing composition contained no abrasive grain, it was possible, by performing the dressing for 10 seconds in advance, to carry out the polishing of the silicon oxide film at a polishing rate of about 4 nm/min.

EXAMPLE 7

A 50% xylene solution of the copolymer having a repeating unit of silyl acrylate and synthesized in the aforementioned Synthesis Example 1, the xylene solution also having dispersed therein 3% by weight (based on the copolymer) of alumina abrasive grains 0.6 µm in average particle diameter, was coated on the abrasive surface of IC1000/Suba-400 (trade name, Rodel Co., Ltd.) to a thickness of about 50 µm and then dried to obtain a polishing cloth. The turntable covered with this polishing cloth was then integrated into the aforementioned polishing apparatus shown in FIG. 1.

Then, a 25 mm square silicon substrate having a copper film formed thereon was prepared. Then, this silicon substrate 6 was secured to the holder 5 of the polishing apparatus shown in FIG. 1 in such a manner that the copper film thereof faced the polishing cloth 2 formed on the surface of the turntable 1. Thereafter, by means of the supporting shaft 4 of holder 5, the silicon substrate 6 was made to contact the polishing cloth 2 formed on the turntable 1 by applying a load of about 300 g/cm² to the silicon substrate 6, while the turntable 1 and the holder 5 were rotated in the same direction, at rotational speeds of 50 rpm and 160 rpm, respectively, a polishing composition was fed from the supply pipe 3 to the polishing cloth 2 at a flow rate of 20 mL/min., thereby polishing the copper film formed on the surface of the silicon substrate 6. Incidentally, the polishing composition employed herein was formed of an aqueous solution comprising 0.5% by weight of quinaldinic acid, 0.6% by weight of lactic acid, 0.9% by weight of a surfactant and 4.5% by weight of hydrogen peroxide.

Further, the dressing for conditioning the state of the surface of polishing cloth was performed by making use of a #80 diamond electrodeposition dresser and under the conditions of 200 g/cm² in load and 160 rpm in rotational speed of the turntable.

As a result, it was confirmed that, in spite of the fact that the polishing composition contained no abrasive grain, it was possible, by performing the dressing for 10 seconds in advance, to carry out the polishing of the copper film at a polishing rate of about 11 nm/min.

EXAMPLE 8

First of all, a polishing slurry consisting of 3.6% by weight of colloidal silica, 1.1% by weight of colloidal alumina, 0.6% by weight of 2-quinoline carboxylic acid (quinaldinic acid), 0.35% by weight of lactic acid, 1.8% by weight of ammonium dodecyl sulfate, 3.9% by weight of hydrogen peroxide, 0.5% by weight of hydroxyethyl cellulose and the balance of water was prepared.

Figure 3A:
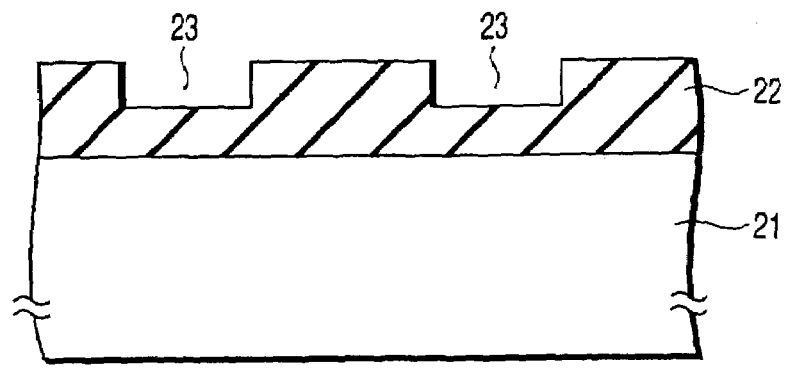
FIGS. 3A, 3B and 3C respectively show a cross-sectional view illustrating the manufacturing step of a semiconductor device in Example 8 of the present invention.
Figure 3B:
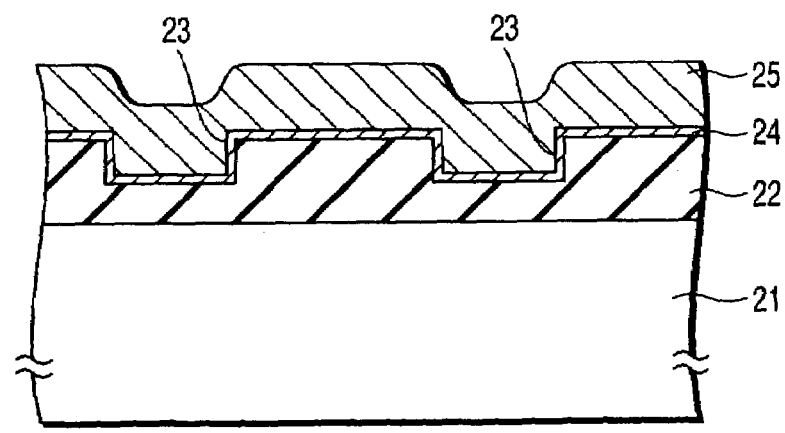

Then, by means of CVD method, an SiO₂ film 22 having a thickness of 1000 nm for example was deposited as an interlayer insulating film on the surface of a silicon substrate 21 provided on the surface thereof with diffusion layers such as source and drain as shown in FIG. 3A. Thereafter, by means of photoetching technique, a plurality of grooves 23 each having a width of 100 μm, a depth of 0.8 μm and a configuration corresponding to a wiring layer were formed. Furthermore, as shown in FIG. 3B, by means of sputter deposition method, a barrier layer 24 made of TiN and having a thickness of 15 nm as well as a Cu film 25 having a thickness of 1.6 μm were successively formed in the mentioned order all over the surface of the SiO₂ film 22 including the surface of aforementioned grooves.

Figure 3C:
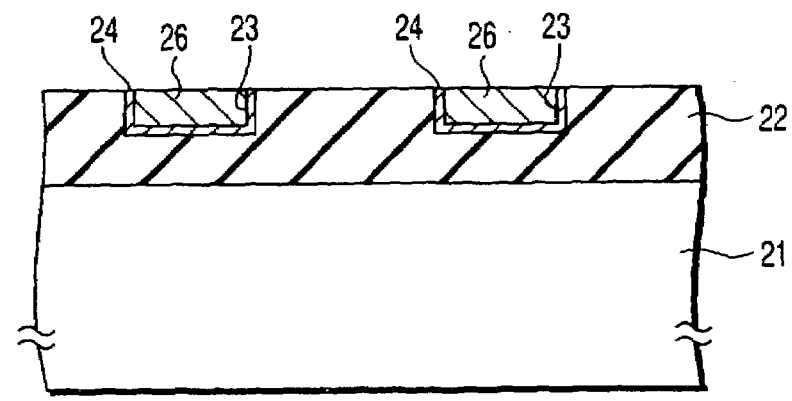

Thereafter, by making use of a polishing apparatus as shown in FIG. 1 which is provided with a turntable having its surface covered with a 0.8 mm thick polishing cloth formed of a copolymer having the same structural formula as employed in Example 1, i.e. the formula (X), a silicon substrate 21 having a Cu film 25 formed thereon was reversely secured to the holder 5 of the polishing apparatus in such a manner that the Cu film 25 thereof faced the polishing cloth 2 formed on the surface of the turntable 1. Thereafter, by means of the supporting shaft 4 of holder 5, the silicon substrate 21 was pressed onto the polishing cloth 2 formed on the turntable 1 by applying a load of about 500 gf/cm² to the silicon substrate 21, while the turntable 1 and the holder 5 were rotated in the same direction, at rotational speeds of 103 rpm and 100 rpm, respectively, the polishing slurry was fed from the supply pipe 3 to the polishing cloth 2 at a flow rate of 50 mL/min., thereby polishing the Cu film 25 film and the barrier layer 24 for a period of about 40 minutes until the SiO₂ film 22 and the barrier layer 24 were exposed, thus forming a buried Cu wiring layer 26 which was enclosed by the barrier layer 24 as shown in FIG. 3C. As a result, a semiconductor device having the buried Cu wiring layer 26 was manufactured.

As explained above, it is now possible according to the present invention to provide a polishing cloth which is capable of exhibiting a stable polishing performance for a relatively long period of time without necessitating a dressing treatment.

It is also possible according to the present invention to provide a polishing cloth which is provided with an automatic abrasive grain-feeding capability and capable of exhibiting a stable polishing performance for a relatively long period of time without necessitating a dressing treatment.

It is further possible according to the present invention to provide a polishing apparatus provided with aforementioned cloth which is capable of exhibiting a stable polishing performance and suited for use in a chemical mechanical polishing (CMP) for forming a buried conductive member such as an embedded wiring layer of a semiconductor device.

It is further possible according to the present invention to provide a method of manufacturing a semiconductor device, which makes it possible to reliably form a conductive member such as a buried wiring layer with high precision in at least one embedding portion selected from groove and opening formed in an insulating film which has been deposited on a semiconductor substrate.

What is claimed is:

1. A polishing cloth comprising an abrasive layer contacted with a subject member to be polished and comprising a polymer material which is hydrolyzable with an aqueous medium, and at least one abrasive grain selected from the group consisting of cerium oxide, manganese oxide, silica, alumina and zirconia, the abrasive grain being dispersed in the polymer material, wherein the polymer material comprises a backbone chain provided with a branched chain having a structure that can be hydrolyzed by an aqueous medium, and the structure being represented by the following formula (I) or (II):

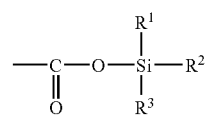

(I)

wherein R¹, R² and R³ may be the same or different and are individually a hydrogen atom, an alkyl group or an aryl group:

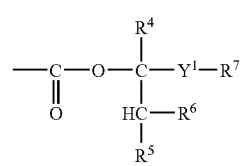

(II)

wherein $R^4$, $R^5$ and $R^6$ may be the same or different and are individually a hydrogen atom or an organic group having 1 to 18 carbon atoms; $R^7$ is an organic group having 1 to 18 carbon atoms; and $R^6$ and $R^7$ may be connected together to form a heterocycle having $Y^1$ as a heteroatom, $Y^1$ being an oxygen atom or a sulfur atom.

2. The polishing cloth according to claim 1, wherein the polymer material is α,β-unsaturated homopolymer or copolymer having a repeating unit represented by the following formula (III) or (IV) each having the formula (I), or formula (V) or (VI) each having the formula (II):

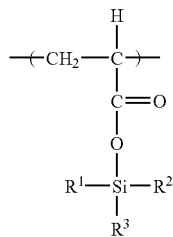

(III)

wherein $R^1$, $R^2$ and $R^3$ may be the same or different and are individually a hydrogen atom, an alkyl group or an aryl group:

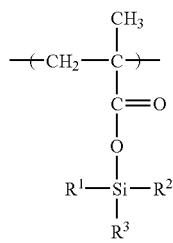

(IV)

wherein $R^1$, $R^2$ and $R^3$ may be the same or different and are individually a hydrogen atom, an alkyl group or an aryl group:

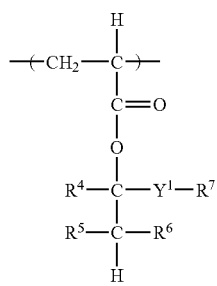

(V)

wherein $R^4$, $R^5$ and $R^6$ may be the same or different and are individually a hydrogen atom or an organic group having 1 to 18 carbon atoms; $R^7$ is an organic group having 1 to 18 carbon atoms; and $R^6$ and $R^7$ may be connected together to form a heterocycle having $Y^1$ as a heteroatom, $Y^1$ being an oxygen atom or a sulfur atom:

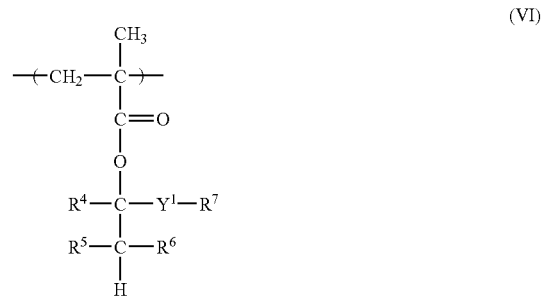

(VI)

wherein $R^4$, $R^5$ and $R^6$ may be the same or different and are individually a hydrogen atom or an organic group having 1 to 18 carbon atoms; $R^7$ is an organic group having 1 to 18 carbon atoms; and $R^6$ and $R^7$ may be connected together to form a heterocycle having $Y^1$ as a heteroatom, $Y^1$ being an oxygen atom or a sulfur atom.

3. The polishing cloth according to claim 2, wherein the polymer material is an α,β-unsaturated homopolymer or copolymer having a repeating unit represented by formula (III).

4. The polishing cloth according to claim 2, wherein the polymer material is an α,β-unsaturated homopolymer or copolymer having a repeating unit represented by formula (IV).

5. The polishing cloth according to claim 2, wherein the polymer material is an α,β-unsaturated homopolymer or copolymer having a repeating unit represented by formula (V).

6. The polishing cloth according to claim 2, wherein the polymer material is an α,β-unsaturated homopolymer or copolymer having a repeating unit represented by formula (VI).

7. The polishing cloth according to claim 1, wherein the polymer material is α,β-unsaturated homopolymer or copolymer having a repeating unit represented by the following formula (III) or (IV) each having the formula (I), or formula (V) or (VI) each having the formula (II):

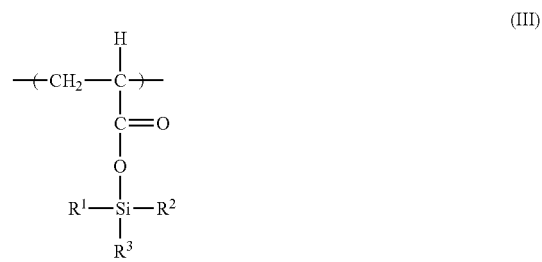

(III)

wherein R¹, R² and R³ may be the same or different and are individually a hydrogen atom, an alkyl group or an aryl group:

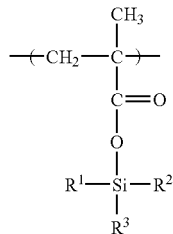

(IV)

wherein R¹, R² and R³ may be the same or different and are individually a hydrogen atom, an alkyl group or an aryl group:

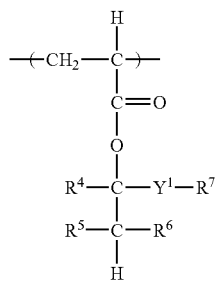

(V)

wherein R⁴, R⁵ and R⁶ may be the same or different and are individually a hydrogen atom or an organic group having 1 to 18 carbon atoms; R⁷ is an organic group having 1 to 18 carbon atoms; and R⁶ and R⁷ may be connected together to form a heterocycle having Y¹ as a heteroatom, Y¹ being an oxygen atom or a sulfur atom:

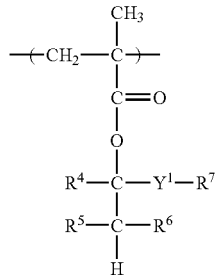

(VI)

wherein R⁴, R⁵ and R⁶ may be the same or different and are individually a hydrogen atom or an organic group having 1 to 18 carbon atoms; R⁷ is an organic group having 1 to 18 carbon atoms; and R⁶ and R⁷ may be connected together to form a heterocycle having Y¹ as a heteroatom, Y¹ being an oxygen atom or a sulfur atom.

8. The polishing cloth according to claim 7 wherein the polymer material is an α,β-unsaturated homopolymer or copolymer having a repeating unit represented by formula (III).

9. The polishing cloth according to claim 7, wherein the polymer material is an α,β-unsaturated homopolymer or copolymer having a repeating unit represented by formula (IV).

10. The polishing cloth according to claim 7, wherein the polymer material is an α,β-unsaturated homopolymer or copolymer having a repeating unit represented by formula (V).

11. The polishing cloth according to claim 7, wherein the polymer material is an α,β-unsaturated homopolymer or copolymer having a repeating unit represented by formula (VI).

12. The polishing cloth according to claim 1, wherein the polymer material comprises a backbone chain provided with a branched chain having a structure that can be hydrolyzed by an aqueous medium, the structure being represented by formula (I).

13. The polishing cloth according to claim 1, wherein the polymer material comprises a backbone chain provided with a branched chain having a structure that can be hydrolyzed by an aqueous medium, the structure being represented by formula (II).

14. A polishing apparatus comprising:
a turntable having a surface which is covered with a polishing cloth having an abrasive layer, contacted with a subject member to be polished, containing a polymer material which is a hydrolyzable with an aqueous medium and at least one kind of abrasive grain selected from the group consisting of cerium oxide, manganese oxide, silica, alumina and zirconia, the abrasive grain being dispersed in the polymer material;
holding means which is rotatively and vertically movably disposed over the turntable and is designed to hold the subject member, the holding means being also designed to impose a desired magnitude of load on the subject member to thereby enable the subject member to be press-contacted with the abrasive cloth of the turntable, and further designed to rotate in the same direction as that of the turntable; and
feeding means for feeding a polishing composition containing at least water and abrasive grain free to the polishing cloth,
wherein the polymer material comprises a backbone chain provided with a branched chain having a structure that can be hydrolyzed by an aqueous medium, and the structure being represented by the following formula (I) or (II):

(I)

wherein R¹, R² and R³ may be the same or different and are individually a hydrogen atom, an alkyl group or an aryl group:

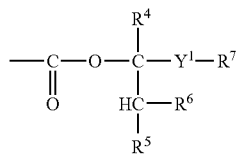

(II)

wherein $R^4$, $R^5$ and $R^6$ may be the same or different and are individually a hydrogen atom or an organic group having 1 to 18 carbon atoms; $R^7$ is an organic group having 1 to 18 carbon atoms; and $R^6$ and $R^7$ may be connected together to form a heterocycle having $Y^1$ as a heteroatom, $Y^1$ being an oxygen atom or a sulfur atom.

15. The polishing apparatus according to claim 14, wherein the polymer material is α,β-unsaturated homopolymer or copolymer having a repeating unit represented by the following formula (III) or (IV) each having the formula (I), or formula (V) or (VI) each having the formula (II):

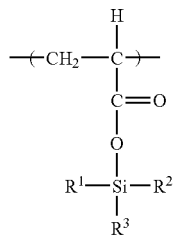

(III)

wherein $R^1$, $R^2$ and $R^3$ may be the same or different and are individually a hydrogen atom, an alkyl group or an aryl group:

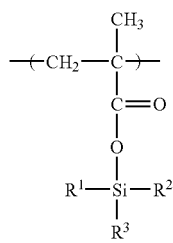

(IV)

wherein $R^1$, $R^2$ and $R^3$ may be the same or different and are individually a hydrogen atom, an alkyl group or an aryl group:

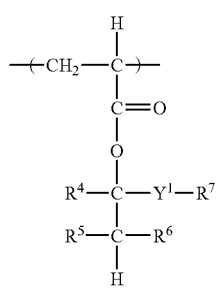

(V)

wherein $R^4$, $R^5$ and $R^6$ may be the same or different and are individually a hydrogen atom or an organic group having 1 to 18 carbon atoms; $R^7$ is an organic group having 1 to 18 carbon atoms; and $R^6$ and $R^7$ may be connected together to form a heterocycle having $Y^1$ as a heteroatom, $Y^1$ being an oxygen atom or a sulfur atom:

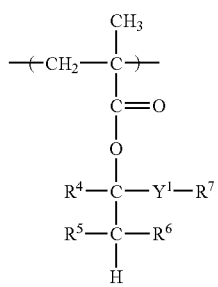

(VI)

wherein $R^4$, $R^5$ and $R^6$ may be the same or different and are individually a hydrogen atom or an organic group having 1 to 18 carbon atoms; $R^7$ is an organic group having 1 to 18 carbon atoms; and $R^6$ and $R^7$ may be connected together to form a heterocycle having $Y^1$ as a heteroatom, $Y^1$ being an oxygen atom or a sulfur atom.

16. The polishing cloth according to claim 15 wherein the polymer material is an α,β-unsaturated homopolymer or copolymer having a repeating unit represented by formula (III).

17. The polishing cloth according to claim 15, wherein the polymer material is an α,β-unsaturated homopolymer or copolymer having a repeating unit represented by formula (IV).

18. The polishing cloth according to claim 15, wherein the polymer material is an α,β-unsaturated homopolymer or copolymer having a repeating unit represented by formula (V).

19. The polishing cloth according to claim 15, wherein the polymer material is an α,β-unsaturated homopolymer or copolymer having a repeating unit represented by formula (VI).

20. The polishing cloth according to claim 14, wherein the polymer material comprises a backbone chain provided with a branched chain having a structure that can be hydrolyzed by an aqueous medium, the structure being represented by formula (I).

21. The polishing cloth according to claim 14, wherein the polymer material comprises a backbone chain provided with a branched chain having a structure that can be hydrolyzed by an aqueous medium, the structure being represented by formula (II).

* * * * *